US011112457B2

(12) United States Patent
Kusko et al.

(10) Patent No.: US 11,112,457 B2
(45) Date of Patent: Sep. 7, 2021

(54) DYNAMIC WEIGHT SELECTION PROCESS FOR LOGIC BUILT-IN SELF TEST

(71) Applicant: International Business Machines Corporation, Armonk, NY (US)

(72) Inventors: Mary P. Kusko, Hopewell Junction, NY (US); Franco Motika, Hopewell Junction, NY (US); Eugene Atwood, Housatonic, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/693,426

(22) Filed: Nov. 25, 2019

(65) Prior Publication Data

US 2021/0156910 A1 May 27, 2021

(51) Int. Cl.
*G01R 31/3177* (2006.01)
*G01R 31/317* (2006.01)
*G01R 31/319* (2006.01)
*G01R 31/3185* (2006.01)
*G01R 31/3183* (2006.01)

(52) U.S. Cl.
CPC ... *G01R 31/3177* (2013.01); *G01R 31/31707* (2013.01); *G01R 31/31835* (2013.01); *G01R 31/31917* (2013.01); *G01R 31/318502* (2013.01); *G01R 31/318544* (2013.01)

(58) Field of Classification Search
CPC .......... G01R 31/3177; G01R 31/31707; G01R 31/31917; G01R 31/318544; G01R 31/318502; G01R 31/31835; G06F 11/27
See application file for complete search history.

(56) References Cited

U.S. PATENT DOCUMENTS

| 4,687,988 A | 8/1987 | Eichelberger et al. |
| 4,688,223 A | 8/1987 | Motika et al. |
| 4,745,355 A | 5/1988 | Eichelberger et al. |

(Continued)

FOREIGN PATENT DOCUMENTS

| WO | 9945667 A1 | 9/1999 |
| WO | 02052288 A2 | 7/2002 |

OTHER PUBLICATIONS

Li et al., "Logic BIST: State-of-the-Art and Open Problems", Mar. 16, 2015, 6 pages, <https://arxiv.org/pdf/1503.04628.pdf>.

(Continued)

*Primary Examiner* — Cynthia Britt
(74) *Attorney, Agent, or Firm* — Monchai Chuaychoo; Edward J. Wixted, III

(57) ABSTRACT

A series of pseudo-random test patterns provide inputs to a logic circuit for performing logic built-in self test (LBIST). A weight configuration module applies one or more weight sets to the pseudo-random test patterns, to generate a series of weighted pseudo-random test patterns. A logic analyzer determines a probability expression for each given net of the logic circuit, based on associated weight sets and a logic function performed by the net. A probability module computes an output probability for each net based on associated probability expressions and associated input probabilities. The weight configuration module optimizes the weight sets, based on the computed net probabilities, and further based on a target probability range bounded by lower and upper cutoff probabilities.

18 Claims, 9 Drawing Sheets

(56) References Cited

U.S. PATENT DOCUMENTS

| | | | |
|---|---|---|---|
| 4,801,870 A | | 1/1989 | Eichelberger et al. |
| 5,983,380 A | * | 11/1999 | Motika .......... G01R 31/318385 |
| | | | 714/733 |
| 6,671,838 B1 | | 12/2003 | Koprowski et al. |
| 6,795,948 B2 | | 9/2004 | Lin et al. |
| 6,968,489 B2 | | 11/2005 | Motika et al. |
| 7,028,239 B2 | | 4/2006 | Jaber |
| 7,162,674 B2 | | 1/2007 | Nozuyama |
| 7,302,624 B2 | | 11/2007 | Rajski et al. |
| 7,484,153 B2 | | 1/2009 | Kiryu et al. |
| 7,526,696 B2 | | 4/2009 | Xiang et al. |
| 7,681,098 B2 | | 3/2010 | Kiryu |
| 7,840,865 B2 | | 11/2010 | Lai et al. |
| 9,568,552 B2 | | 2/2017 | Lin et al. |
| 9,933,485 B2 | | 4/2018 | Mrugalski et al. |
| 2002/0087931 A1 | | 7/2002 | Jaber |
| 2006/0236182 A1 | * | 10/2006 | Xiang ............ G01R 31/318544 |
| | | | 714/734 |
| 2007/0273401 A1 | * | 11/2007 | Kiryu ............ G01R 31/318572 |
| | | | 326/16 |
| 2008/0235544 A1 | | 9/2008 | Lai et al. |
| 2015/0169423 A1 | | 6/2015 | Cook et al. |

OTHER PUBLICATIONS

Mahajan, Abhishek, "Improving fault coverage for random pattern-resistant designs", EDN Network, Dec. 3, 2015, 6 pages, <https://www.edn.com/design/integrated-circuit-design/4440967/Improving-fault-coverage-for-random-pattern-resistant-designs>.

Motika et al., "Logic Built-In Self Test Dynamic Weight Selection Method", U.S. Appl. No. 16/693,434, filed Nov. 25, 2019, 46 pages.

IBM, "List of Patent Applications Treated As Related", Appendix P, Filed Herewith, 2 pages.

Waicukauski et al., "A method for generating weighted random test patterns", in IBM Journal of Research and Development, vol. 33, No. 2, Mar. 1989, pp. 149-161.

Ercolani et al., "Estimate of Signal Probability in Combinational Logic Networks", IEEE, 1989, pp. 132-138.

* cited by examiner

| NET 801 | LOGIC GATE | | FAN-IN 804 | EXH 805 | EQU 806 | MOC 807 | MOC% 808 |
| --- | --- | --- | --- | --- | --- | --- | --- |
| | ID 802 | FUNCTION 803 | | | | | |
| 0 | - | - | - | 0.500 | 0.500 | 0.503 | 0.3 |
| 1 | - | - | - | 0.500 | 0.500 | 0.508 | 0.8 |
| 2 | - | - | - | 0.500 | 0.500 | 0.485 | -1.5 |
| 3 | - | - | - | 0.500 | 0.500 | 0.492 | -0.8 |
| 4 | - | - | - | 0.500 | 0.500 | 0.486 | -1.4 |
| 5 | U1 | AND | [0,1] | 0.250 | 0.250 | 0.255 | 0.5 |
| 6 | U2 | INV | [2] | 0.500 | 0.500 | 0.515 | 1.5 |
| 7 | U3 | OR | [3,4] | 0.750 | 0.750 | 0.735 | -1.5 |
| 8 | U4 | AND | [5,6] | 0.125 | 0.125 | 0.132 | 0.7 |
| 9 | U5 | AND | [6,7] | 0.375 | 0.375 | 0.377 | 0.2 |

| ORIGINAL WEIGHT ↓ | NET → PROBABILITY OF "1" ↓ | 0 P[0] | 1 P[1] | 2 P[2] | 3 P[3] | 4 P[4] | 5 P[5] | 6 P[6] | 7 P[7] | 8 P[8] | 9 P[9] | WEIGHTED PROBABILITY AVERAGE OF ALL NETS ↓ |
|---|---|---|---|---|---|---|---|---|---|---|---|---|
| 1/2 | 1/2 | 0.5000 | 0.5000 | 0.5000 | 0.5000 | 0.5000 | 0.3500 | 0.5000 | 0.7500 | 0.1250 | 0.3750 | 0.4000 |
| 1/16 | 1/16 | 0.0625 | 0.0625 | 0.0625 | 0.0625 | 0.0625 | 0.0039 | 0.9375 | 0.1211 | 0.0037 | 0.1135 | 0.2359 |
| 1/8 | 1/8 | 0.1250 | 0.1250 | 0.1250 | 0.1250 | 0.1250 | 0.0156 | 0.8750 | 0.2344 | 0.0137 | 0.2051 | 0.2688 |
| 3/16 | 3/16 | 0.1875 | 0.1875 | 0.1875 | 0.1875 | 0.1875 | 0.0352 | 0.8125 | 0.3398 | 0.0296 | 0.2761 | 0.2984 |
| 1/4 | 1/4 | 0.2500 | 0.2500 | 0.2500 | 0.2500 | 0.2500 | 0.0625 | 0.7500 | 0.4375 | 0.0469 | 0.3381 | 0.3250 |
| 5/16 | 5/16 | 0.3125 | 0.3125 | 0.3125 | 0.3125 | 0.3125 | 0.0977 | 0.6875 | 0.5273 | 0.0671 | 0.3635 | 0.3484 |
| 3/8 | 3/8 | 0.3750 | 0.3750 | 0.3750 | 0.3750 | 0.3750 | 0.1406 | 0.6250 | 0.6094 | 0.0879 | 0.3809 | 0.3688 |
| 7/16 | 7/16 | 0.4375 | 0.4375 | 0.4375 | 0.4375 | 0.4375 | 0.1914 | 0.5625 | 0.6836 | 0.1077 | 0.3845 | 0.3859 |
| 9/16 | 9/16 | 0.5625 | 0.5625 | 0.5625 | 0.5625 | 0.5625 | 0.3164 | 0.4375 | 0.8066 | 0.1384 | 0.3539 | 0.4109 |
| 5/8 | 5/8 | 0.6250 | 0.6250 | 0.6250 | 0.6250 | 0.6250 | 0.3906 | 0.3750 | 0.8594 | 0.1465 | 0.3223 | 0.4188 |
| 11/16 | 11/16 | 0.6875 | 0.6875 | 0.6875 | 0.6875 | 0.6875 | 0.4727 | 0.3125 | 0.9023 | 0.1477 | 0.2820 | 0.4234 |
| 3/4 | 3/4 | 0.7500 | 0.7500 | 0.7500 | 0.7500 | 0.7500 | 0.5625 | 0.2500 | 0.9375 | 0.1406 | 0.2344 | 0.4250 |
| 13/16 | 13/16 | 0.8125 | 0.8125 | 0.8125 | 0.8125 | 0.8125 | 0.6602 | 0.1875 | 0.9648 | 0.1238 | 0.1809 | 0.4234 |
| 7/8 | 7/8 | 0.8750 | 0.8750 | 0.8750 | 0.8750 | 0.8750 | 0.7656 | 0.1250 | 0.9844 | 0.0957 | 0.1230 | 0.4188 |
| 15/16 | 15/16 | 0.9375 | 0.9375 | 0.9375 | 0.9375 | 0.9375 | 0.8789 | 0.0625 | 0.9961 | 0.0549 | 0.0623 | 0.4109 |
| 0 | 0 | 0.0000 | 0.0000 | 0.0000 | 0.0000 | 0.0000 | 0.0000 | 1.0000 | 0.0000 | 0.0000 | 0.0000 | 0.2000 |
| 1 | 1 | 1.0000 | 1.0000 | 1.0000 | 1.0000 | 1.0000 | 1.0000 | 0.0000 | 1.0000 | 0.0000 | 0.0000 | 0.4000 |

800D

| ORIGINAL WEIGHT | PROBABILITY OF "1" | NET → | 0 P[0] | 1 P[1] | 2 P[2] | 3 P[3] | 4 P[4] | 5 P[5] | 6 P[6] | 7 P[7] | 8 P[8] | 9 P[9] | WEIGHTED PROBABILITY AVERAGE OF 2ND GROUPING |
|---|---|---|---|---|---|---|---|---|---|---|---|---|---|
| 1/2 | Mixed | | 0.6875 | 0.6875 | 0.5000 | 0.5000 | 0.5000 | 0.4727 | 0.5000 | 0.7500 | 0.3363 | 0.3750 | 0.4538 |
| 1/16 | Mixed | | 0.6875 | 0.6875 | 0.0625 | 0.0625 | 0.0625 | 0.4727 | 0.9375 | 0.1211 | 0.4431 | 0.1135 | 0.2269 |
| 1/8 | Mixed | | 0.6875 | 0.6875 | 0.1250 | 0.1250 | 0.1250 | 0.4727 | 0.8750 | 0.2344 | 0.4136 | 0.2051 | 0.2843 |
| 3/16 | Mixed | | 0.6875 | 0.6875 | 0.1875 | 0.1875 | 0.1875 | 0.4727 | 0.8125 | 0.3398 | 0.3840 | 0.2761 | 0.3233 |
| 1/4 | Mixed | | 0.6875 | 0.6875 | 0.2500 | 0.2500 | 0.2500 | 0.4727 | 0.7500 | 0.4375 | 0.3545 | 0.3281 | 0.3734 |
| 5/16 | Mixed | | 0.6875 | 0.6875 | 0.3125 | 0.3125 | 0.3125 | 0.4727 | 0.6875 | 0.5279 | 0.3250 | 0.3635 | 0.4049 |
| 3/8 | Mixed | | 0.6875 | 0.6875 | 0.3750 | 0.3750 | 0.3750 | 0.4727 | 0.6250 | 0.6094 | 0.2954 | 0.3809 | 0.4285 |
| 7/16 | Mixed | | 0.6875 | 0.6875 | 0.4375 | 0.4375 | 0.4375 | 0.4727 | 0.5625 | 0.6836 | 0.2659 | 0.3845 | 0.4447 |
| 9/16 | Mixed | | 0.6875 | 0.6875 | 0.5625 | 0.5625 | 0.5625 | 0.4727 | 0.4375 | 0.8086 | 0.2068 | 0.3539 | 0.4564 |
| 5/8 | Mixed | | 0.6875 | 0.6875 | 0.6250 | 0.6250 | 0.6250 | 0.4727 | 0.3750 | 0.8594 | 0.1772 | 0.3223 | 0.4530 |
| 11/16 | Mixed | | 0.6875 | 0.6875 | 0.6875 | 0.6875 | 0.6875 | 0.4727 | 0.3125 | 0.9023 | 0.1477 | 0.2820 | 0.4440 |
| 3/4 | Mixed | | 0.6875 | 0.6875 | 0.7500 | 0.7500 | 0.7500 | 0.4727 | 0.2500 | 0.9375 | 0.1182 | 0.2344 | 0.4300 |
| 13/16 | Mixed | | 0.6875 | 0.6875 | 0.8125 | 0.8125 | 0.8125 | 0.4727 | 0.1875 | 0.9648 | 0.0886 | 0.1809 | 0.4113 |
| 7/8 | Mixed | | 0.6875 | 0.6875 | 0.8750 | 0.8750 | 0.8750 | 0.4727 | 0.1250 | 0.9844 | 0.0591 | 0.1230 | 0.3888 |
| 15/16 | Mixed | | 0.6875 | 0.6875 | 0.9375 | 0.9375 | 0.9375 | 0.4727 | 0.0625 | 0.9961 | 0.0295 | 0.0623 | 0.3636 |
| 0 | 0 | | 0.0000 | 0.0000 | 0.0000 | 0.0000 | 0.0000 | 0.0000 | 1.0000 | 0.0000 | 0.0000 | 0.0000 | 0.0000 |
| 1 | 1 | | 1.0000 | 1.0000 | 1.0000 | 1.0000 | 1.0000 | 1.0000 | 0.0000 | 1.0000 | 0.0000 | 0.0000 | 0.3333 |

Fig. 8D

DYNAMIC WEIGHT SELECTION PROCESS FOR LOGIC BUILT-IN SELF TEST

BACKGROUND

The present invention relates generally to the field of integrated circuit testing, and more particularly to approaches and algorithms for dynamic weight selection for testing logic circuits.

A logic built-in self test (LBIST) applies pseudo-random patterns as inputs to a logic block of a device-under-test (DUT). The logic block generates outputs, based on the inputs. The outputs are compared to expected outputs to verify correct function of the logic block. The default or un-weighted pseudo-random patterns have an equal probability of a bit being a logical "0" or logical "1". Weights are sometimes applied to the random patterns, to depart from the default probability, to improve test coverage of the DUT.

SUMMARY

According to an aspect of the present invention, there is a method, computer program product and/or system that performs the following operations (not necessarily in the following order): (i) generating a probability model corresponding to a logic circuit where the logic circuit comprises (a) a plurality of input nets including a first input net, (b) a plurality of logic elements including a first logic element, and (c) a plurality of output nets including a first output net; (ii) receiving an input probability corresponding to the first input net; (iii) receiving a target output probability range bounded by a lower cutoff probability and an upper cutoff probability; (iv) computing an output probability corresponding to the first output net, based on a combination of the input probability and the probability model; (v) determining that the output probability falls outside the target output probability range; and (vi) in response to determining that the output probability falls outside the target output probability range, modifying the input probability.

BRIEF DESCRIPTION OF THE DRAWINGS

FIG. 8C shows a table of node probabilities for the example logic diagram in accordance with at least one embodiment of the present invention; and FIG. 8D shows a table of interim node probabilities in accordance with at least one embodiment of the present invention.

DETAILED DESCRIPTION

Figure 1:
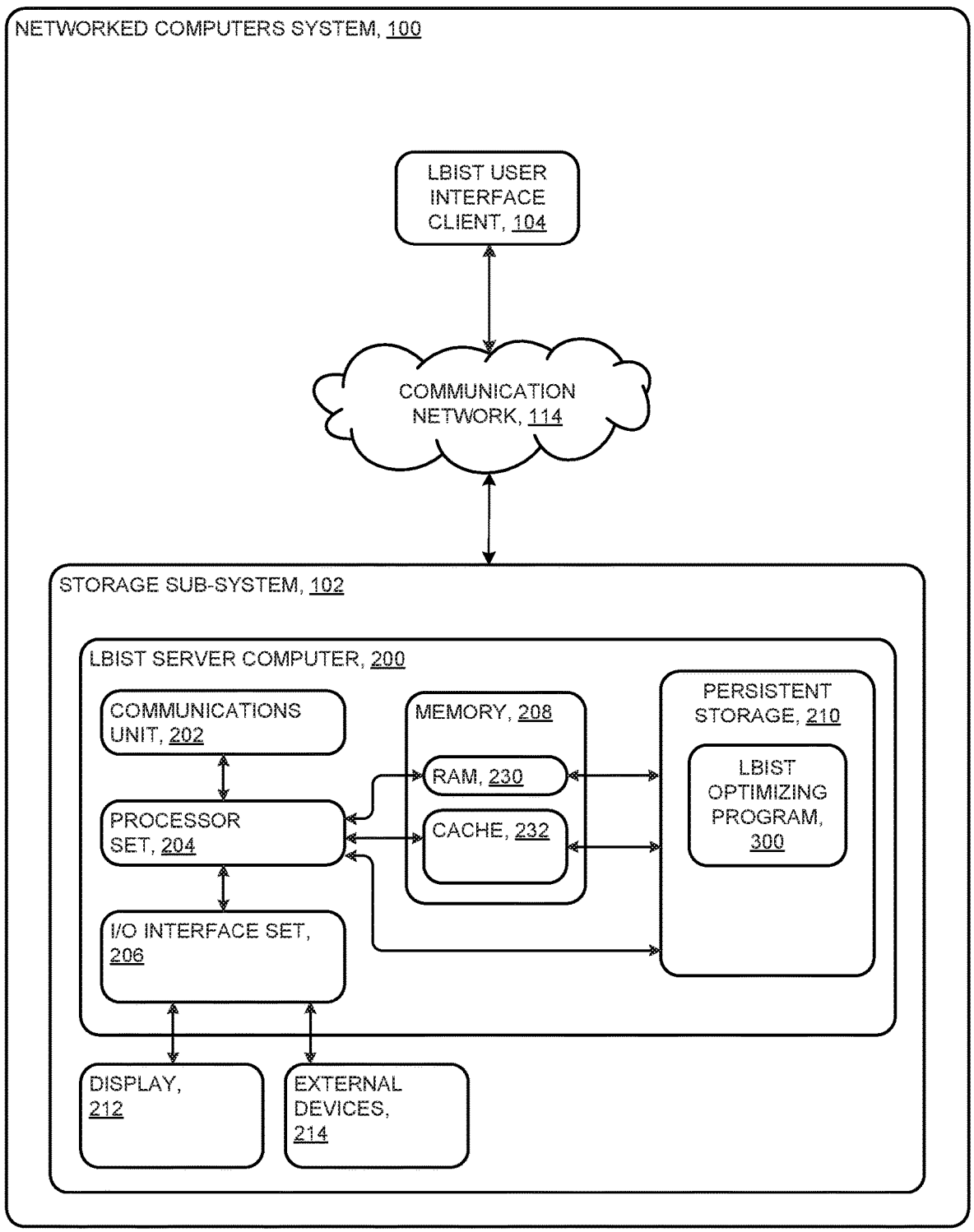
FIG. 1 is a block diagram of a first embodiment of a system according to the present invention.

Some embodiments of the present invention configure a set of weights to produce a series of weighted pseudo-random test patterns for testing, and/or simulating, operation of logic circuits (such as a logic block of a semiconductor chip or other circuit device) and/or logic circuit designs. A logic analyzer determines a probability expression (for example, a mathematical polynomial) for each given net of the logic block, based on the logic element of the net and the input(s) thereto. A weight configuration module determines a weighting factor to be applied to each input net. The weighting factors collectively comprise a weight set. In some embodiments, a plurality of weight sets may be applied to the logic block. A probability module resolves respective polynomials to compute numerical results. The numerical results represent a probability for each intermediate and output net, based on the respective probability expressions and the associated weight sets. The weight configuration module modifies the weight sets, based on the probabilities of the intermediate and output nets, and further based on a target probability range bounded by lower and upper cutoff probabilities, to generate optimized weight sets. A test pattern generator generates a series of pseudo-random test patterns, based on the optimized weight sets. Weight selection hardware configuration for LBIST testing is based on the optimized weight sets to: (i) optimize a logic built-in self test process; (ii) maximize test coverage; (iii) minimize untested faults; (iv) minimize pattern set and test time; (v) facilitate detection of untested faults; and/or (vi) improve test coverage performance of the LBIST.

As will be appreciated by persons skilled in the relevant art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects and may generally be referred to herein as a "circuit," "module", or "system." Moreover, aspects of the present invention may take the form of a computer program product embodied in one or more computer readable medium(s) having computer readable program code/instructions embodied thereon.

This Detailed Description section is divided into the following sub-sections: (i) The Hardware and Software Environment; (ii) Example Embodiment; (iii) Further Comments and/or Embodiments; and (iv) Definitions.

I. THE HARDWARE AND SOFTWARE ENVIRONMENT

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

An embodiment of a possible hardware and software environment for software and/or methods according to the present invention will now be described in detail with reference to the Figures. FIG. 1 is a functional block diagram illustrating various portions of networked computers system 100, including: storage sub-system 102; LBIST user interface client 104; communication network 114; LBIST server computer 200; communications unit 202; processor set 204; input/output (I/O) interface set 206; memory device 208; persistent storage device 210; display device 212; external devices 214; random access memory (RAM) devices 230; cache memory device 232; and LBIST optimizing program 300.

Storage sub-system 102 is, in many respects, representative of the various computer sub-system(s) in the present invention. Accordingly, several portions of storage sub-system 102 will now be discussed in the following paragraphs.

Storage sub-system 102 may be a laptop computer, tablet computer, netbook computer, personal computer (PC), a desktop computer, a personal digital assistant (PDA), a smart phone, or any programmable electronic device capable of communicating with the client sub-systems via communication network 114. Program 300 is a collection of machine readable instructions and/or data that is used to create, manage, and control certain software functions that will be discussed in detail, below, in the Example Embodiment sub-section of this Detailed Description section.

Storage sub-system 102 is capable of communicating with other computer sub-systems via communication network 114. Communication network 114 can be, for example, a local area network (LAN), a wide area network (WAN) such as the Internet, or a combination of the two, and can include wired, wireless, or fiber optic connections. In general, communication network 114 can be any combination of connections and protocols that will support communications between server and client sub-systems.

Storage sub-system 102 is shown as a block diagram with many double arrows. These double arrows (no separate reference numerals) represent a communications fabric, which provides communications between various components of storage sub-system 102. This communications fabric can be implemented with any architecture designed for passing data and/or control information between processors (such as microprocessors, communications and network processors, etc.), system memory, peripheral devices, and any other hardware components within a system. For example, the communications fabric can be implemented, at least in part, with one or more buses.

Memory device 208 and persistent storage device 210 are computer-readable storage media. In general, memory device 208 can include any suitable volatile or non-volatile computer-readable storage media. It is further noted that, now and/or in the near future: (i) external devices 214 may be able to supply, some or all, memory for storage sub-system 102; and/or (ii) devices external to storage sub-system 102 may be able to provide memory for storage sub-system 102.

Program 300 is stored in persistent storage device 210 for access and/or execution by one or more of the respective computer processor set 204, usually through one or more memories of memory device 208. Persistent storage device 210: (i) is at least more persistent than a signal in transit; (ii) stores the program (including its soft logic and/or data), on a tangible medium (such as magnetic or optical domains); and (iii) is substantially less persistent than permanent storage. Alternatively, data storage may be more persistent and/or permanent than the type of storage provided by persistent storage device 210.

Program 300 may include both machine readable and performable instructions and/or substantive data (that is, the type of data stored in a database). In this particular embodiment, persistent storage device 210 includes a magnetic hard disk drive. To name some possible variations, persistent storage device 210 may include a solid state hard drive, a semiconductor storage device, read-only memory (ROM), erasable programmable read-only memory (EPROM), flash memory, or any other computer-readable storage media that is capable of storing program instructions or digital information.

The media used by persistent storage device 210 may also be removable. For example, a removable hard drive may be used for persistent storage device 210. Other examples include optical and magnetic disks, thumb drives, and smart cards that are inserted into a drive for transfer onto another computer-readable storage medium that is also part of persistent storage device 210.

Communications unit 202, in these examples, provides for communications with other data processing systems or devices external to storage sub-system 102. In these examples, communications unit 202 includes one or more network interface cards. Communications unit 202 may provide communications through the use of either or both physical and wireless communications links. Any software modules discussed herein may be downloaded to a persistent storage device (such as persistent storage device 210) through a communications unit (such as communications unit 202).

I/O interface set 206 allows for input and output of data with other devices that may be connected locally in data communication with LBIST server computer 200. For example, I/O interface set 206 provides a connection to external devices 214. External devices 214 will typically include devices such as a keyboard, keypad, a touch screen, and/or some other suitable input device. External devices 214 can also include portable computer-readable storage media such as, for example, thumb drives, portable optical or magnetic disks, and memory cards. Software and data used to practice embodiments of the present invention, for example, program 300, can be stored on such portable computer-readable storage media. In these embodiments, the relevant software may (or may not) be loaded, in whole or in part, onto persistent storage device 210 via I/O interface set 206. I/O interface set 206 also connects in data communication with display device 212.

Display device 212 provides a mechanism to display data to a user and may be, for example, a computer monitor or a smart phone display screen.

The programs described herein are identified based upon the application for which they are implemented in a specific embodiment of the invention. However, it should be appreciated that any particular program nomenclature, herein, is used merely for convenience, and, thus, the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

II. EXAMPLE EMBODIMENT

Figure 2:
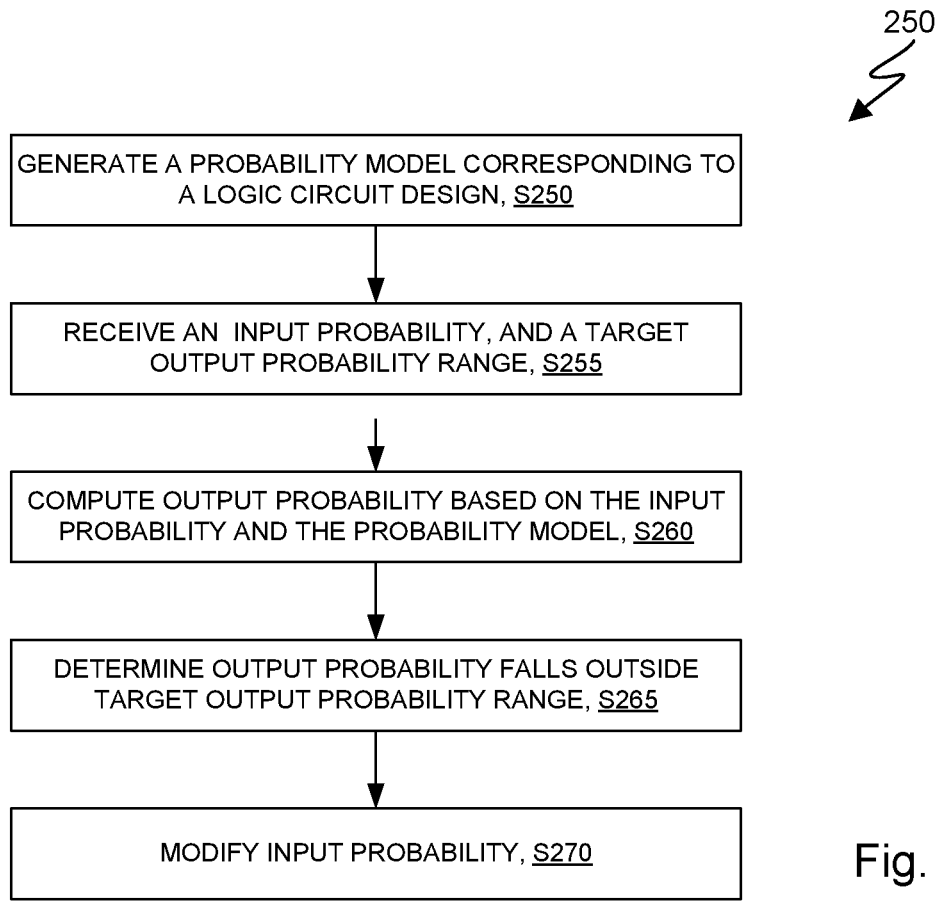
FIG. 2 is a flowchart showing a first embodiment method performed, at least in part, by the first embodiment system.
Figure 3:
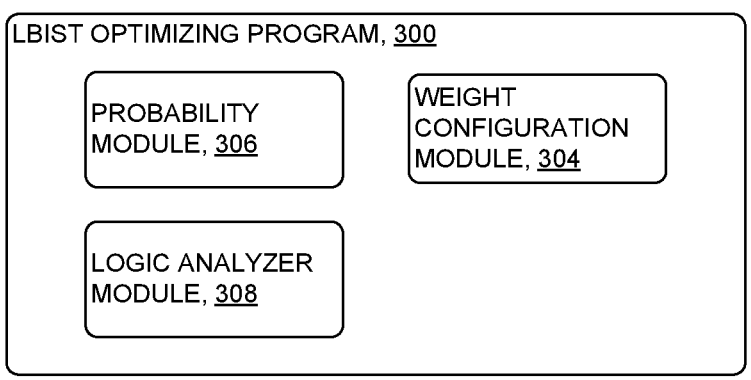
FIG. 3 is a block diagram showing a machine logic (for example, software) portion of the first embodiment system.

FIG. 2 shows flowchart 250 depicting a method according to the present invention. FIG. 3 shows program 300 for performing at least some of the method operations of flowchart 250. This method and associated software will now be discussed, over the course of the following paragraphs, with extensive reference to FIG. 2 (for the method operation blocks) and FIG. 3 (for the software blocks).

Processing begins at operation S250, where logic analyzer module 308, of LBIST optimizing program 300, generates a probability model corresponding to a logic circuit design (sometimes herein referred to as a logic block). In some embodiments of the present invention, the probability model comprises a set of polynomials, or other mathematical expressions, where each polynomial expresses the output probability of a corresponding logical element as a function of the probability(ies) of the input(s) to the logical element, and the function performed by the logical element. The probability model, as a whole, expresses the probabilities of all nets (or a subset of the nets) comprising the logic block. Further detail with respect to generation of a probability model is given below with respect to FIGS. 8A, 8B, and 8C, in the "Further Comments and/or Embodiments" subsection of this "Detailed Description" section.

The probability model includes input net probabilities, intermediate net probabilities, and output net probabilities produced by the logic block. Intermediate nets produce outputs that feed forward to downstream logic elements in the logic block. The probabilities of intermediate and output nets are a function (or set of functions) of the input probabilities and the respectively corresponding logic elements. The term "net" as used herein is synonymous with the terms "line", "signal", "signal line" or similar terms. These terms may herein be used interchangeably. A net comprises any one of the signal lines within the logic block, including the input lines, any lines within the logic block, and the output lines. The "probability" of a net refers to the probability that the net, in a physical embodiment, or a computed simulation of the logic block, will be at a logical "1" state, that is $P\{1\}$, at any given moment during operation or simulation. Similarly, the probability of "0", that is $P\{0\}$, is the complement probability, that is $P\{0\}=1-P\{1\}$.

A logic element performs a Boolean function that takes one or more binary inputs (depending on the function of the logic element and the fan-in of inputs to the logic element) and produces a binary output. Examples of primary logic functions making up the logic block include: (i) AND; (ii) OR; (iii) NOT (inverse); (iv) NAND (inverse of AND); (v) NOR (inverse of OR); (vi) XOR (exclusive-OR); and/or (vii) XNOR (inverse of XOR).

Processing proceeds at operation S255, where weight configuration module 304, of LBIST optimizing program 300, receives a range of initial weightings (a plurality of weight sets), to be applied to the logic block input lines. In some embodiments, the range of initial weights includes all values between 0 and 1 inclusive, in increments of $\frac{1}{16}$. That is: 0, $\frac{1}{16}$, $\frac{1}{8}$, $\frac{3}{16}$ . . . $\frac{13}{16}$, $\frac{7}{8}$, $\frac{15}{16}$, and 1. In some embodiments, other increments are also considered. Each weight value (0, $\frac{1}{16}$, $\frac{1}{8}$, etc.) is applied in turn to all input nets. Alternatively, in some embodiments, weight configuration module 304 generates an initial weighting configuration where the input nets may, or may not, be given the same weights.

Further, probability module 306, of LBIST optimizing program 300 receives a target output probability range, bounded by lower and upper cutoff probabilities. In some embodiments, the universe of all possible output probabilities (from "0" to "1") for any given net, is subdivided by the lower and upper cutoff probabilities into: (i) a probability range between "0" and the lower cutoff, (ii) the target probability range bounded by the lower and upper cutoff probabilities, and (iii) a probability range between the upper cutoff and "1". The probability ranges (i) and (iii), being outside the target probability range (ii), in some embodiments, are targeted for analysis aimed at achieving better fault coverage, and/or better test coverage.

Processing proceeds at operation S260, where, for each weight set (weighting configuration), of the plurality of weight sets, applied to the inputs of the logic block, probability module 306 computes resultant output net probabilities. For example, stepping through the range of weights generated in operation S255 in the paragraph above, probability module 306 computes: (i) a set of net probabilities resulting from an input weighting of 0 applied to all input lines; (ii) a set of net probabilities resulting from an input weighting of $\frac{1}{16}$ applied to all input lines; (iii) a set of net probabilities resulting from an input weighting of $\frac{1}{8}$, etc., and (iv) continuing to step through the entire range of weights and computing a set of net probabilities resulting from each input weight. For more detail with respect to the above, refer to FIG. 8C and the associated discussion below in the Further Comments and/or Embodiments sub-section of this Detailed Description section.

The probability of each input line is based on corresponding weight of the weight set. In some embodiments of the present invention, the initial weighting scheme assumes a $\frac{1}{2}$ (0.5) probability for each input line. In some embodiments, an initial weighting scheme may be based on: (i) certain factors of the logic block design; (ii) known characteristics of upstream logic block(s), the outputs of which comprise corresponding inputs into the logic block under study; (iii) experience gained from past logic block designs; and/or (iv) any number of other factors. As to a weighted random test pattern generator, the weight applied to a given input line directly correlates to the probability of that line. For example, if a weight of 0.75 is applied to a given input line, the probability that the given input line will have been a logical 1, after generation of a sufficiently large number of random patterns, will approach 0.75. The input weights, and input probabilities, are herein used synonymously.

Processing proceeds at operation S260 where probability module 306 computes all net probabilities based on each weight set applied to the input nets, and the probability model generated in operation S250 above.

Processing proceeds at operation S265, where probability module 306 identifies a set of outlier nets. Nets that fall outside of the target probability range are termed "outlier nets". The target probability range lies between the lower and upper cutoffs. In some embodiments of the present invention, the target probability range is based on any of the following approaches, applied separately or in any combination: (i) a default range determined based on past experience; (ii) by observing the calculated range of probabilities and establishing a target range such that a threshold maximum percentage (or maximum number) of the nets fall outside the target range; (iii) downstream considerations such as expected further time and resources that would be needed to address out-of-target nets; and/or (iv) any other approach deemed appropriate in any particular embodiment. Further with respect to item (ii) above, consider the following example: assume a threshold is established that sets an allowable maximum of 5% of nets that may fall outside the target range. Once probability module 306 has computed probabilities of all nets, a target range is established that results in no more than 5% of the nets falling outside target range. In some embodiments, the upper and lower cutoffs are equidistant from the central probability of $\frac{1}{2}$ (0.5).

Processing proceeds at operation S270, where weight configuration module 304 modifies one or more weight configurations, based on the set of outlier nets, with a goal that the resulting net probabilities, on the whole, move in a favorable way (move toward, and/or fall within, the target output probability range), and not in unfavorable way (failing to move toward, and/or fall within, the target output probability range), thereby reducing the number of outlier nets and maximizing the number of nets falling within the target output probability range.

III. FURTHER COMMENTS AND/OR EMBODIMENTS

During the design phase of a circuit chip, sometimes herein referred to as a "die" or "semiconductor die", system-on-chip (SOC), integrated circuit (IC), system-on-module, or system-on-board, a design-for-test (DFT) engineer simulates a logic built-in self test (LBIST) for some number of test cycles, using inputs based on random patterns. Faults, within the LBIST tested domain are marked off as tested once a net is stimulated or exercised, and the test stimulates (and/or observes) transitions to each (all) of a net's possible states. Faults are marked tested once the faulty behavior propagates to an observation point. For a net to be fully tested, transitions are needed to each (all) of the net's possible states. Because of the nature of random pattern generation in combination with random resistant fault topologies, some nets may not be tested (and/or marked off as tested). These are called "untested faults". Some embodiments of the present invention apply network probability calculations and/or simulations (where applicable) to determine the observation node probability of observing an applied stimulus. Some embodiments carry the calculations symbolically, which enables determination of optimal channel weights (sometimes herein referred to as target channel weights), channel range weights and latch ranges.

Early in the process, the method identifies "hardest to detect" network paths by using the probabilistic method calculations or simulations. Once weights are determined, the method uses those weights to run a deterministic fault simulation where it marks off "easy to detect" faults, analogous to evaluations using 50% weighted patterns. The method identifies which weights should be applied at the "global", "channel" and "cluster" stages of selecting weights. The method simulates any remaining untested faults using automated test pattern generation (ATPG), applies stimuli based on the weights determined above, and observes outputs of the logic unit under test.

Stated in general terms, in some embodiments, a weight assignment algorithm applies a set of weights, simulates the effects those weights have on the untested faults, and repeats (applying weight sets, simulating the effects) until: (i) the untested fault list declines to below a specified maximum acceptable quantity (or percentage); (ii) the repeated application of the weight setting algorithm has a specified minimum effect on reducing the untested fault set (having reached a state of diminishing returns); (iii) the time, effort and/or resources expended reach a specified maximum; and/or (iv) a maximum pattern count is reached.

An algorithm, in accordance with some embodiments of the present invention, creates specific LBIST sequences based on analysis of the untested faults. The analysis classifies remaining (untested) faults based, at least, on: (i) stimulus sources; (ii) observation locations; (iii) logic clustering; (iv) geometric clustering; and/or (v) cell or hierarchical cell clustering. Deterministic modeling identifies controls which produce observability of remaining untested faults. Such controls may include sequential stimuli. The analysis evaluates controlling values and sequences to determine an LBIST weighting utility or utilities that can gain observability of the targeted (untested) faults. Once the simulation process has been exercised, the DFT engineer may analyze any remaining faults for test point inclusion, or for automatic test pattern generation (ATPG).

Some embodiments of the present invention may include one, or more, of the following features, characteristics, and/or advantages, with respect, at least, to large and complex integrated devices and/or SOCs: (i) evaluates the logic model to generate probability equations for each respective block; (ii) determines optimal channel, channel latch groups and individual latch weights which comprises an ordered iterative evaluation and reduction of the logic model based on generation and analysis of logic based probability and fault analysis for each respective logic block; (iii) integrates a comprehensive LBIST method; (iv) reduces test time, data volume and overall test cost; (v) enhances test pattern generation process, LBIST and ATPG; (vi) improves test coverage (in some embodiments, test coverage is specified as the percentage of all modeled faults that are detected by the applied test patterns for a specific design) and resulting shipped product quality level (SPQL); and/or (vii) provides built-in ATPG capability.

Some embodiments, employ an alternative, non-analytic, probabilistic method of LBIST weight determination. The method simulates remaining faults by using an iterative percent coverage metric which "hunts" for coverage. Hunting may include binary or counting pattern methods to select weights, channels, latch channel ranges and/or individual latch weights. The method performs a Venn analysis to determine the effectiveness of applied weights, channels, latch channel ranges and/or individual latch weights. The analysis informs the designers with respect to the amount of latch range and individual latch weights which could be included in the LBIST design to meet various overhead, test time and coverage requirements.

Some embodiments of the present invention, employ a hardware sampling method involving a sufficiently large sample of IC chips of a circuit design under study. The method applies (to each sampled IC chip) a broad range of weights, channels, latch channel ranges and/or individual latch weights, at varying voltages, to empirically determine which combinations of weights, channels, latch channel ranges and/or individual latch weights are most effective in testing unmodeled faults. In some embodiments, exit criteria for the algorithm includes targets for testing time, and coverage (of, at least, unmodeled faults). Data collected during this testing, in some embodiments: (i) may reveal signature differences from chip to chip, thus providing information useful to the design team; (ii) influence the product design specification and/or design rules; and/or (iii) provide a basis for determining scan latch probabilities, where the scan latch is one of back traced uncovered fault(s). In some embodiments, for register arrays, soft arrays are simulated to allow exploration of the design space and to optimize design choices.

Some embodiments of the present invention comprise a method for testing a logical circuit of a semiconductor chip. The method comprises: (i) determining a plurality of logical chains of the logical circuit; (ii) generating a weighted bit chain for testing a portion of the dependent on the plurality of logical chains; (iii) determining an alternate weighted bit chain for at least one logical chain of the plurality of chains, wherein the alternate bit chain weight is based on determining the proportion of fault coverage and fault observation probability of the at least one logical chain based on the weighted chain; and/or (iv) operating the semiconductor chip using the weighted bit chain in the portion of the plurality of logical chains and the alternate weighted bit chain for the at least one logical chain of the plurality of chains.

A process in accordance with some embodiments of the present invention may include one, or more, of the following features, characteristics, and/or advantages: (i) evaluates a logic model corresponding to a logic block of a circuit device; (ii) determines logic equations associated with the logic model; (iii) calculates node probabilities; (iv) determines weights associated with test patterns; and/or (v) optimizes test coverage and test time.

Figure 4:
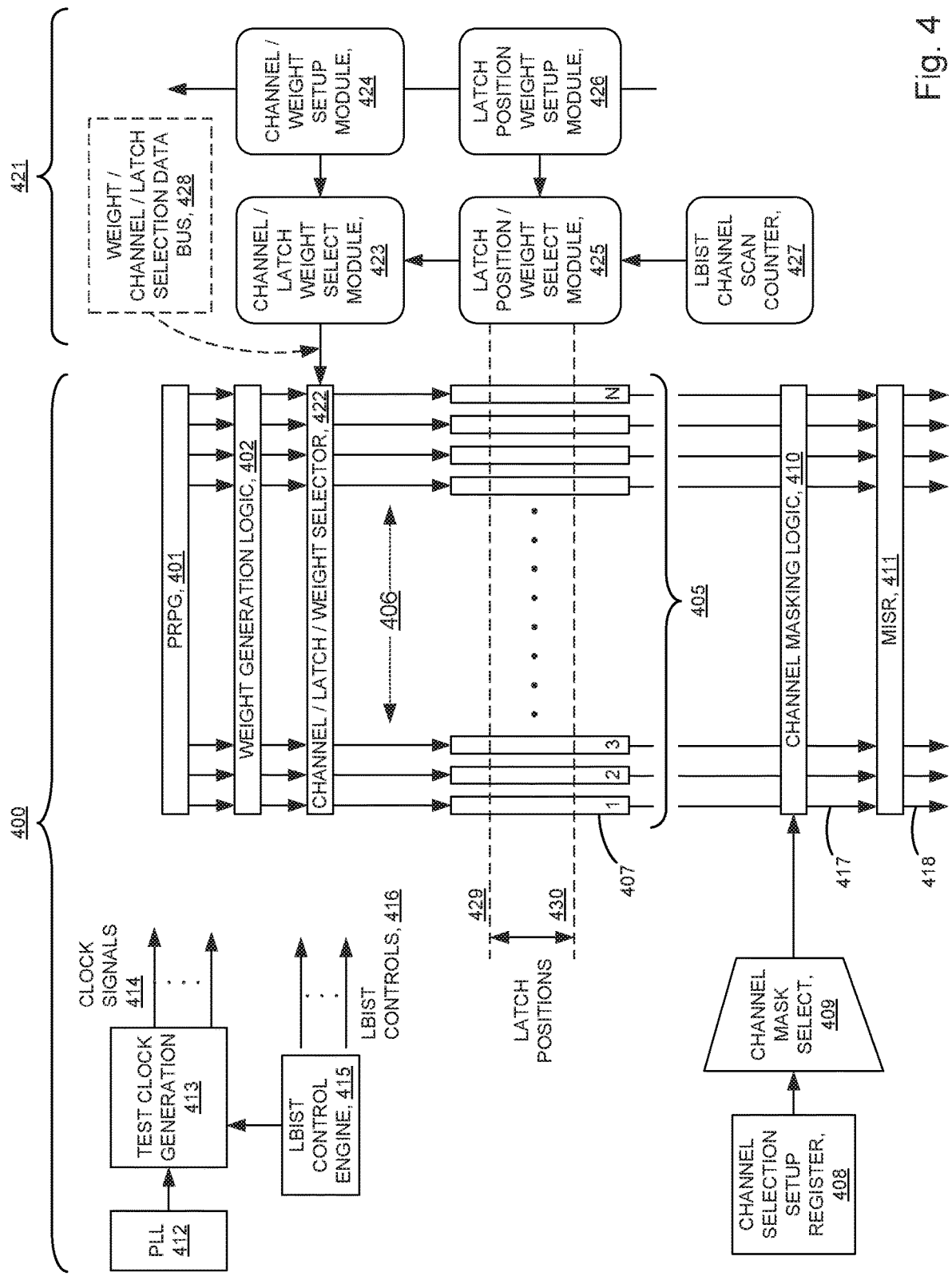
FIG. 4 is a block diagram showing a base section of a logical built-in self test dynamic scan or "self test using multiple input signature register and pseudo-random pattern generator" (STUMP) channel selection in accordance with at least one embodiment of the present invention.

FIG. 4 is a block diagram showing a LBIST dynamic weight selection concept in accordance with some embodiments of the present invention. FIG. 4 includes LBIST base structure 400, and dynamic weight setup and selection control 421.

LBIST base structure 400 includes: pseudo-random pattern generator, PRPG 401; weight generation logic 402; chain configuration 405 (32-channels in some embodiments); LBIST channel 407 (sometimes herein referred to as "STUMP chains"); channel selection setup register 408; channel mask select 409; channel masking logic 410 (channel selector); multiple input signature register, MISR 411; phase locked loop, PLL 412; system functional and test clock generation 413; system functional and clock signals 414 (sometimes herein referred to as test clock signals); LBIST control engine 415; LBIST controls 416 (clocks and controls distribution); and/or MISR input signals 417. Some embodiments implement multiple instances of this configuration (LBIST base structure 400) in a device under test (DUT). When there are multiple configuration instances, not all elements of FIG. 4 are necessarily repeated. For example, in some embodiments, one PLL is shared across all the LBIST instances, whereas some embodiments have one PLL for each instance. Still other embodiments have any combination of PLLs where some LBIST instances share a PLL, and some LBIST instances have one PLL for each instance.

In some embodiments of the present invention, weight generation logic 402 serially shifts or loads weighted pseudo-random stream bits (channels 406) into each respective chain, one bit at a time. LBIST controls 416 control the shifting. Weight generation logic 402 alters the data coming out of PRPG 401 (generating weighted pseudo-random bit streams) and going into channels 406. This loading shift process is repeated for the length of the longest channel, until all latches in chain configuration 405 structure are loaded. In some embodiments, while the data are being scan loaded into channels 406, the data is being unloaded (see chain configuration 405) into the MISR 411 (as may be modified by channel masking logic 410). LBIST channel 407 similarly unloads the selected channels at the output end. Contents of the latches are clocked into the MISR via mask select 409 to generate a signature. Channel mask select 409 in conjunction with channel masking logic 410 determine which scan data actually is unloaded into MISR 411.

Chain configuration 405 represents an N channel chain configuration comprising system latches and combinational logic to be tested by the execution of multiple LBIST tester loops and test sequences. Although FIG. 4 shows multiple STUMP channel 407 (STUMP chains) as having the same length, some embodiments have fewer or more chains of equal and/or unequal lengths. Further, while FIG. 4 shows N instances of LBIST channel 407, where for discussion herein, N=32, some embodiments have other numbers of LBIST channel 407 (for example, 16, 64, or any other number). However, the number of channels (N) and length of each channel may vary from embodiment to embodiment. STUMP chains are formed by concatenating functional latches in a serial scan chain, whereas in mission mode the latches are clocked and loaded via a broadside port.

In some embodiments of the present invention, channel selection setup register 408, sets up channel selections. Different channel selections may be loaded for multiple execution passes of the logic test.

In some embodiments of the present invention, channel mask select 409 receives, for a given logic test, channel mask register contents from channel selection setup register 408, and applies the register contents to mask or disable the scan output of specific channels.

In some embodiments of the present invention, channel masking logic 410 implements each channel's respective masking logic in accordance with the channel masking determined by channel selection setup register 408 and controlled by channel mask select 409.

Dynamic weight setup and selection control 421, of FIG. 4, includes: channel/latch/weight selector 422; channel/latch weight select module 423; channel/weight setup module 424; latch position/weight select module 425; latch position weight setup module 426; LBIST channel scan counter 427; weight/channel/latch selection data bus 428; latch range top 429; and/or latch range bottom 430. Some embodiments implement multiple instances of this configuration (dynamic weight setup and selection control 421) in a DUT. In some embodiments, a DUT implements multiple instances of the structure represented by FIG. 4.

In some embodiments of the present invention, pseudo-random pattern generator (PRPG 401) is implemented as a linear feedback shift register (LFSR). PRPG 401 and/or an LFSR may be 32-bits in length, and configured with feedback taps to generate 'maximal' length states (that is, $2^n-1$ possible states, where n is the LFSR bit or latch length). While the Figures show an N-STUMP chain configuration LBIST structure (where N=32 channels in some embodiments), some embodiments of the present invention apply to smaller or larger configurations as well. In some embodiments, PRPG 401 comprises multiple pseudo-random pattern generator instances (and/or multiple instances of LFSR). For simplicity and convenience in description, the multiple instances of PRPG 401 (and LFSR), collectively, will be referred to in the singular.

In some embodiments of the present invention, weight generation logic 402 (sometimes herein referred to as a "spreading network") is shared for multiple instances of LBIST channel chain configuration 405. Weight generation logic 402 generates a set of selectable weights that are based on the pseudo-random probability of ½ (equal probability of "0" or "1" state) for each STUMP chain fed by the PRPG.

In some embodiments of the present invention, multiple input signature register, MISR 411, is similar to LFSR (and PRPG 401) but adds exclusively ORed (XORed) inputs for each latch position. Output from each selected LBIST channel 407 feeds into a respectively corresponding MISR 411 input. MISR 411 compresses large numbers of bits generated during the LBIST test, to produce MISR input signals 417. MISR 411 unloads MISR input signals 417, whereupon the LBIST test system compares MISR output signature 418 to an expected signature. In some embodiments, MISR 411 comprises multiple "multiple input signature register"

instances. For simplicity and convenience in description, the multiple instances of MISR 411, collectively, will herein be referred to in the singular.

In some embodiments of the present invention, phase lock loop, PLL 412, is part of the system clock generation function. PLL 412 generates internal high frequency functional clocks based on externally supplied reference clocks.

In some embodiments of the present invention, system functional and test clock generation 413 generates system functional and test clock signals 414 based on input received from PLL 412. System functional and clock signals 414 include support for LBIST clocking and associated scan clocks (system and scan clocks).

In some embodiments of the present invention, LBIST control engine 415 controls sequencing, loop control and execution of PRPG 401, MISR 411, and channel scan and control of the test logic. Further, LBIST control engine 415 controls LBIST channel scan counter 427. LBIST control engine 415 supports one or more channel structures concurrently. Further, LBIST control engine 415 distributes LBIST controls 416 throughout the structure of FIG. 4.

Structures and components that enable dynamic weight selection, and apply selected weights to the generation of the pseudo-random bit streams, which in turn are applied to the scan channels in the LBIST configuration include: (i) channel/latch weight select module 423 (channel-latch-weight modes); (ii) channel/weight setup module 424; (iii) latch position/weight select module 425; and (iv) latch position weight setup module 426.

Dynamic weight setup and selection control 421 comprises channel/latch weight select module 423, and channel/weight setup module 424. Dynamic weight setup and selection control 421 sets up and controls the dynamic weight selection modes described below.

Channel/latch/weight selector 422 dynamically selects one of the weighted bits for each channel on every scan cycle. Channel/latch/weight selector 422 is an extension of dynamic weight setup and selection control 421, both enabling the select function. Channel/latch weight select module 423 generates weight/channel/latch selection data bus 428 for each channel on every scan cycle, based on a combination of data generated by: (i) channel/weight setup module 424; and (ii) latch position weight setup module 426. In some embodiments, weight/channel/latch selection data bus 428 is 3-bits wide. In some embodiments, the selection data has other bit widths (for example, 4-bits wide).

Channel/weight setup module 424 is a set of one or more registers, preloaded with channel/weight setup data. Some embodiments implement other forms of storage and selection of the channel/weight setup data, such as register arrays, scan chains, etc.

Latch position/weight select module 425 enables dynamic latch select mode, and provides latch specific position comparison setup data. Function enablement for a specific latch select instance is accomplished by comparing the setup data to the existing LBIST channel scan counter.

Latch position weight setup module 426 is a set of one or more registers, preloaded with latch position setup data. Some embodiments implement other forms of storage and selection of the latch position setup data, such as register arrays, scan chains, etc.

LBIST channel scan counter 427 cycles scans (load and unload) concurrently for all the channels. LBIST channel scan counter 427 cycles the counter based on the longest channel length, and is controlled by LBIST control engine 415.

Weight/channel/latch selection data bus 428, carries data generated by channel/latch weight select module 423, to channel/latch/weight selector 422.

Latch range top 429 depicts one of many possible latch position match points. Latch range bottom 430 depicts another one of many possible latch position match points. Each latch position match point extends from the first latch in a channel to the last latch in the longest channel.

Alternatively, in some embodiments, latch range top 429, together with latch range bottom 430, respectively define the top and bottom ends of a selected, contiguous set of latch position match points. Latch range may be inclusive or exclusive.

Figure 5:
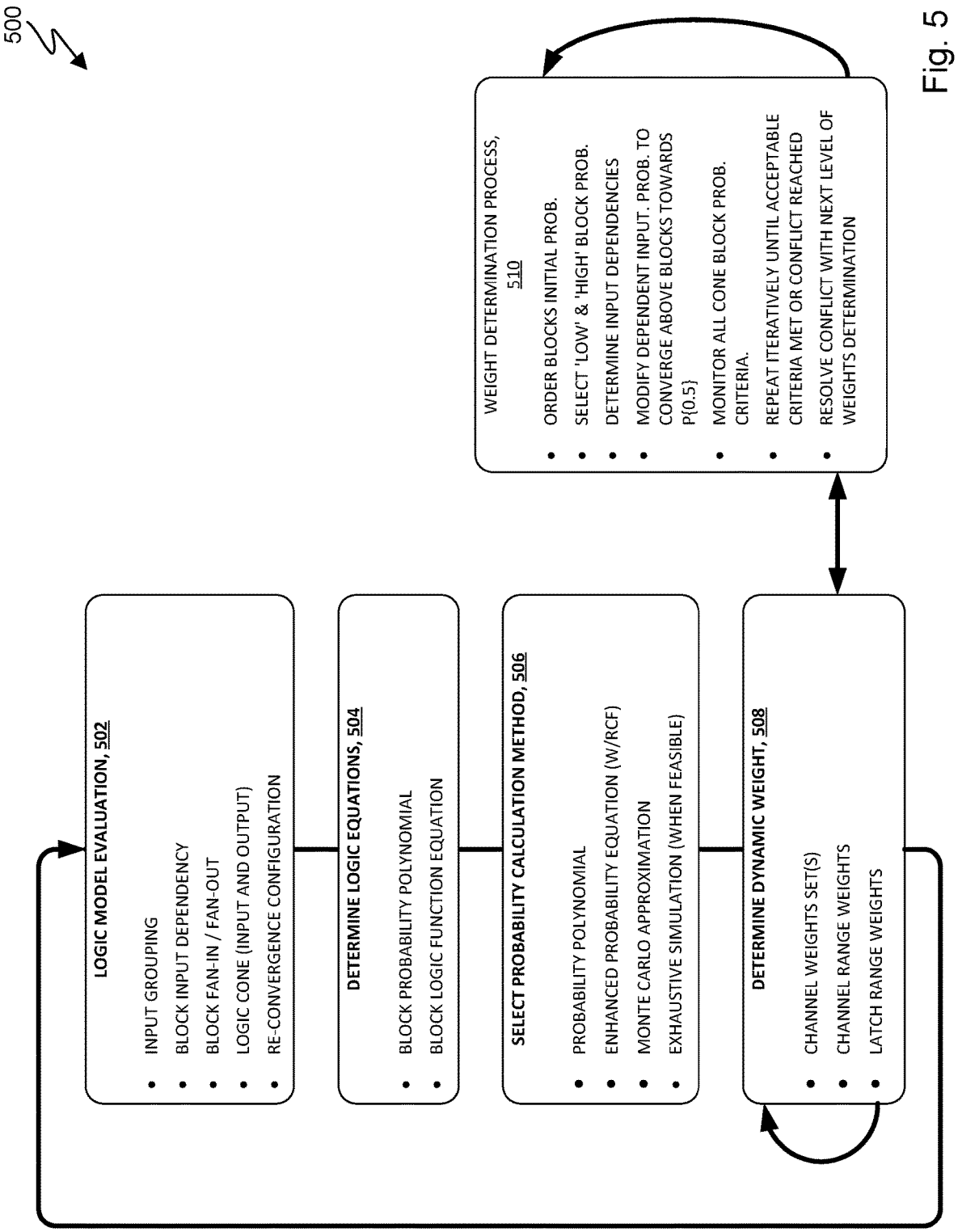
FIG. 5 is a block diagram showing an overview of a weight determination process flow in accordance with at least one embodiment of the present invention.

Block diagram 500 of FIG. 5 shows an overview of a weight determination process flow in accordance with some embodiments of the present invention, to determine an optimal set of channel weights, channel range weights and/or latch range weights for a given block of logic, represented by a logic model.

In some embodiments of the present invention, a LBIST dynamic weight selection process performs the following operations with respect to an integrated circuit (IC) design: (i) evaluates the logic model embodied in the IC; (ii) determines a set of logic equations respectively corresponding to logic blocks in the IC design; (iii) computes node probabilities respectively corresponding to the logic blocks; (iv) determines optimal weights (sometimes herein referred to as target weights) to be applied to test patterns; and/or (v) optimizes test coverage and test time associated with testing (and/or test simulation) of the IC design. These operations will now be described with respect to block diagram 500 of FIG. 5.

Processing begins at logic model evaluation 502, where logic analyzer module 308 (see FIG. 3) analyzes the logic model, to perform: (i) input grouping; (block input dependency; (iii) block fan-in/fan-out; (iv) logic cone (input and output); and/or (v) re-convergence configuration. The process breaks down the design into primary logic "blocks", such as logical AND gates, OR gates, INV, etc. The process determines relationships between the logic block and upstream logic blocks feeding into it (fan-in). The process sometimes identifies special relationships such as re-convergent fan-out. The process groups logic blocks based on respective controlling inputs. In some embodiments, controlling inputs (at the highest level) are "self test using 'multiple input signature register' (MISR) and 'pseudo-random pattern generator' (PRPG)" (STUMP) channels.

Processing proceeds at operation 504, "determine logic equations", where once logic analyzer 308 (see FIG. 3) has analyzed the logic model (see logic model evaluation 502, above), logic analyzer 308 performs the following operations associated with each logic block: (i) generates a probability polynomial corresponding to the path from the inputs to the logic block; and/or (ii) calculates a logic equation based on inputs to the logic block. An example is provided below, with respect to FIGS. 8A-8D.

Processing proceeds at operation 506, "select probability calculation method", where once the logic equations have been generated, the process generates the probability for each inter-block net, based on the given set of inputs. Initially, inputs are grouped based on the STUMP channel. The process calculates the probability for each net on each logic block. To calculate the probabilities, a variety of analysis processes may be used including: (i) generating a probability polynomial; (ii) performing Monte Carlo simulation(s); and/or (iii) performing exhaustive simulation(s). Refer to the example below with respect to FIGS. 8A-8D, where example calculated results from several probability calculations are shown. Note that these represent only some examples of probability calculations. Many other calculation processes remain within the spirit and scope of the present invention. Note also, that in the example, all inputs are assumed to be on one STUMP channel. However, in some embodiments, inputs on different stumps channels have different weights and are handled accordingly.

Processing proceeds at operation 508, "determine dynamic weight". Once the probabilities for each net have been determined, the nets are ordered based on their respective probabilities. The process determines a first set of weights for a set of nets that have probabilities above or below a predetermined threshold (or a percentage of the set of nets where the set of nets contains the highest and lowest calculated probabilities). The weights may comprise channel weights set(s), channel range weights, and/or latch range weights. The optimal predetermined probability value for each net is based, at least in part, on a primary logic block type that drives the corresponding net.

The process described above with respect to operation 508, "determine dynamic weight", includes operation 510, "weight determination process". Starting with nets that have extreme probabilities and/or greatest deviations from respective optimal values determined above, the process determines input values that produce a favorable change in a given net's respective probability. The extreme probabilities, for example, can be set by choosing to work with a percentage of nets, which in some embodiments, constitute a subset of nets based on the respective values of their calculated probabilities. A favorable probability change moves the probability away from extremes and toward an optimal probability (a target output probability range). The analysis completes when probability of the given net reaches a predetermined magnitude. In some embodiments, attention must be directed to latches and their affiliated STUMP channels. This process continues until a threshold is reached. Once the threshold is reached and a set of values are determined, some embodiments run fault simulation (testability analysis) to validate that a fault associated with the low probability net will be detected. Once this is done, the input values are saved and the corresponding nets are removed as a criteria for further analysis, by exclusion from the list.

The following enumerated list summarizes operations performed in some embodiments of the present invention.

1. Analyze design, generate block list.
2. Generate probability and logic equations for each block, back from inputs.
3. Generate probabilities based on channels.
4. Determine optimal probability, based on universe of calculated results, and record input channel and/or input weights. Output: channel weights and blocks that have desired probabilities.
5. Exclude blocks that have optimal switching and return to step 3 above. Repeat steps 3, 4, and 5 until a threshold probability deviation value is reached. Exclude blocks that have desired probability. The "threshold" is based on an 'acceptable criteria', which is a predetermined or preset probability deviation value from the optimally calculated probability for the node(s) being evaluated. In some embodiments, this deviation is determined and/or limited by the size of the patterns, number of tester loops, weight selection hardware limitations, design of a specific device-under-test and test time budget.
6. Once threshold is reached, run x amount of LBIST test cycles for input set of channel weights used above. Remove detected nodes from the block list. In some embodiments, increase repeat count before proceeding to step 7.
7. Generate probabilities based on latch groups. Define the latch groups based on backward cone from untested faults (from step 6). Start with nodes furthest away from the optimal block probability. Hardware configuration may influence latch group sizes, numbers and locations.
8. Determine optimal probability, based on universe of calculated results, and record input latch group.
9. Exclude blocks that have optimal switching and return to step 7 above. Repeat steps 7, 8, and 9 until threshold reached.
10. Once threshold reached, run x amount of LBIST test cycles for input set of channel latches used above. Remove detected nodes from the block list. Optionally track the of number of times that inputs are generated for a node, but are unsuccessful in detecting the node. Optionally, increase repeat count before proceeding to step 11.
11. Generate probabilities based on individual latches.
12. Determine optimal probability, based on universe of calculated results, and record input latches.
13. Exclude blocks that have optimal switching and return to step 11 above. Repeat steps 11, 12, and 13 until threshold reached.
14. Once threshold reached, run x amount of LBIST test cycles for specific latches used above. Remove detected nodes from the block list. Optionally increase repeat count before proceeding to next step.
15. Run ATPG on remaining untested faults.
16. Repeat steps 1-15 until hardware weight selection resources are exhausted.

Some embodiments repeat the procedure, as described in the enumerated list (above) and FIGS. 4 and 5, for decreasing ranges of inputs. Each iteration of the channel weight selection process works with (acts upon) nets remaining in the ordered list which were not excluded by the previous iteration. The number of STUMP channels, the range or ranges which are separately controllable, is based at least in part on design characteristics of the logic circuit under study. Each iteration uses individual latch weights with the remaining nets of interest, to create a set of individual latch weigh probabilities.

Some nets of interest may remain un-excluded once iterations of the channel weight selection process is concluded. Some embodiments use the remaining nets as ATPG targets, and sequentially apply resulting deterministic latch weights.

Figure 6:
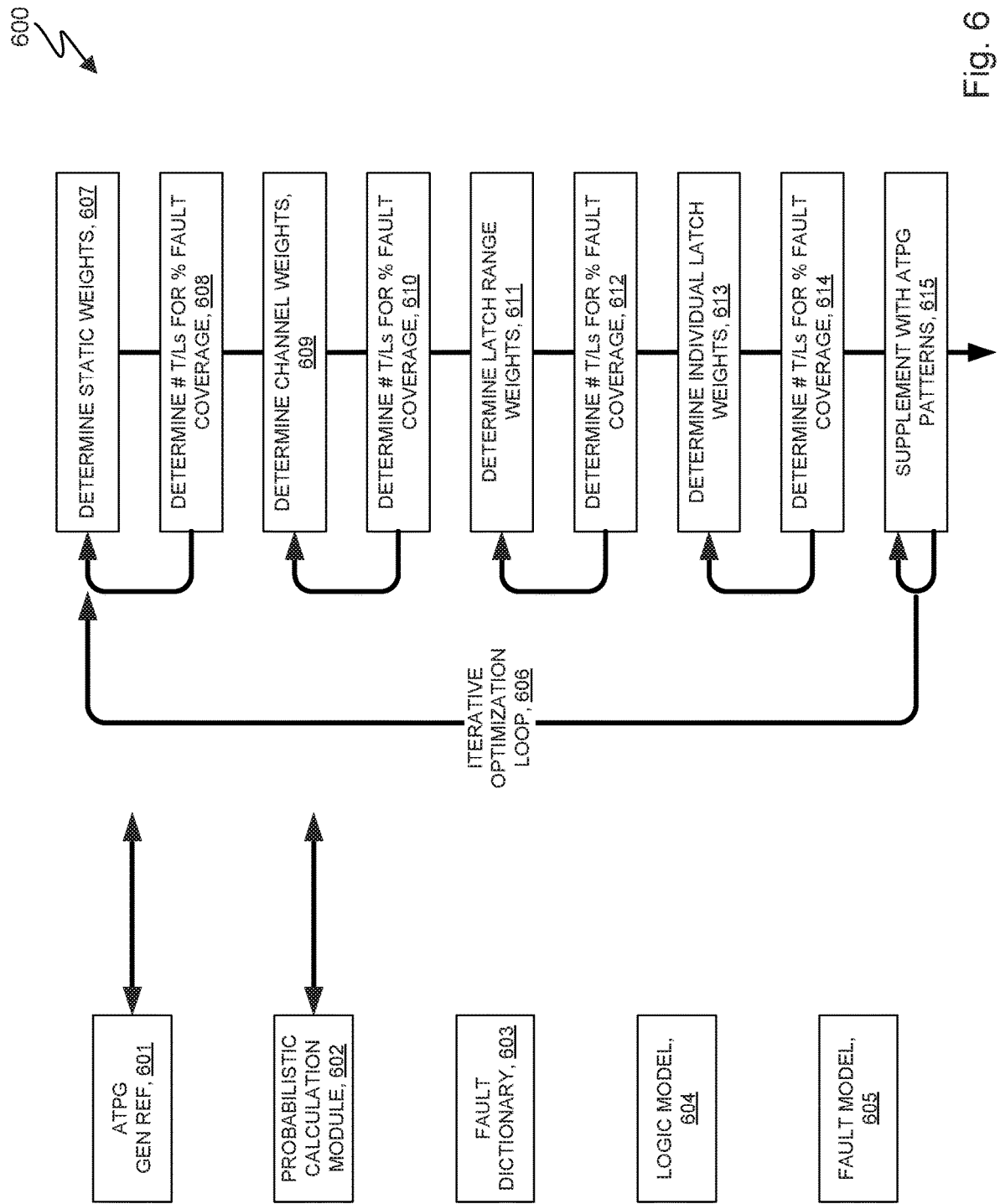
FIG. 6 shows a process flow and some related components in accordance with at least one embodiment of the present invention.

Block diagram 600, of FIG. 6 shows a process flow and some related components in accordance with some embodiments of the present invention. Block diagram 600 includes: automatic test pattern generator (ATPG gen ref module 601); probabilistic calculation module 602; fault dictionary 603; logic model 604 (representing a logic block under study); fault model 605; and processing operations 606, 607, 608, 609, 610, 611, 612, 613, 614, and 615.

Processing begins at operation 607 where a static/dynamic select multiplexer (not shown in the Figures) determines a set of static weights to be pushed onto a logic chain of the a logic block under study.

Processing proceeds at operation 608, where probabilistic calculation module 602 determines a number of tester loops (T/Ls) needed to achieve a pre-determined percentage of fault coverage, based on the static weights determined in operation 607 above. The number of tester loops is the same as the number of LBIST test patterns. That is, each tester loop corresponds to a different LBIST test pattern. An example of an LBIST test pattern, in some embodiments, comprises concurrent channel load/unload and one or more system clocks.

Operations 607 and 608 are iterated, until a target percentage of fault coverage is achieved. In some embodiments, establishment of a fault coverage target is based, at least in part, on system shipped product quality level (SPQL) requirements.

Processing proceeds at operation 609 where a dynamic channel weight select module (channel/latch weight select module 423 of FIG. 4) determines a set of channel weights. The dynamic channel weight select module comprises a set of registers that are loaded with the dynamic channel/weight/latch/hold selection data.

Processing proceeds at operation 610, where probabilistic calculation module 602 determines a number of tester loops needed to achieve a pre-determined percentage of fault coverage based on the channel weights determined in operation 609 above.

Operations 609 and 610 are iterated, until a target percentage of fault coverage is achieved.

Processing proceeds at operation 611 where a latch range select module (not shown in the Figures) determines a set of latch range weights. The latch range select module represents the range of latches that can be selected, which encompasses all the latch positions for the longest scan channel. In some embodiments, the latch range function also supports the complement range selection, that is, all latches in the chain outside the range.

Processing proceeds at operation 612, where probabilistic calculation module 602 determines a number of tester loops needed to achieve a pre-determined percentage of fault coverage based on the latch range weights determined in operation 611 above.

Operations 611 and 612 are iterated, until a target percentage of fault coverage is achieved.

Processing proceeds at operation 613 where a latch individual weight select module (not shown in the Figures) determines a set of individual latch weights.

Processing proceeds at operation 614, where probabilistic calculation module 602 determines a number of tester loops needed to achieve a pre-determined percentage of fault coverage based on the individual latch weights determined in operation 613 above.

Operations 613 and 614 are iterated, until a target percentage of fault coverage is achieved.

Processing proceeds at operation 615, where ATPG generation reference module 601 generates automated test patterns to supplement the static weights, channel weights, latch range weights, and/or individual latch weights determined in operations 607 through 614 (inclusive). Some embodiments repeat the process comprising operations 607 through 615, in iterative optimization loop 606.

In some embodiments, pre-determined percentage of fault coverage referenced in each weight selection loop (comprising operations: 607-608; 609-610; 611-612; and/or 613-614) is variable, and is optimized for each weight selection loop. Processing can exit from anywhere within iterative optimization loop 606 when criteria (for percent fault coverage, test time, and/or any other processing resource) is met.

Figure 7:
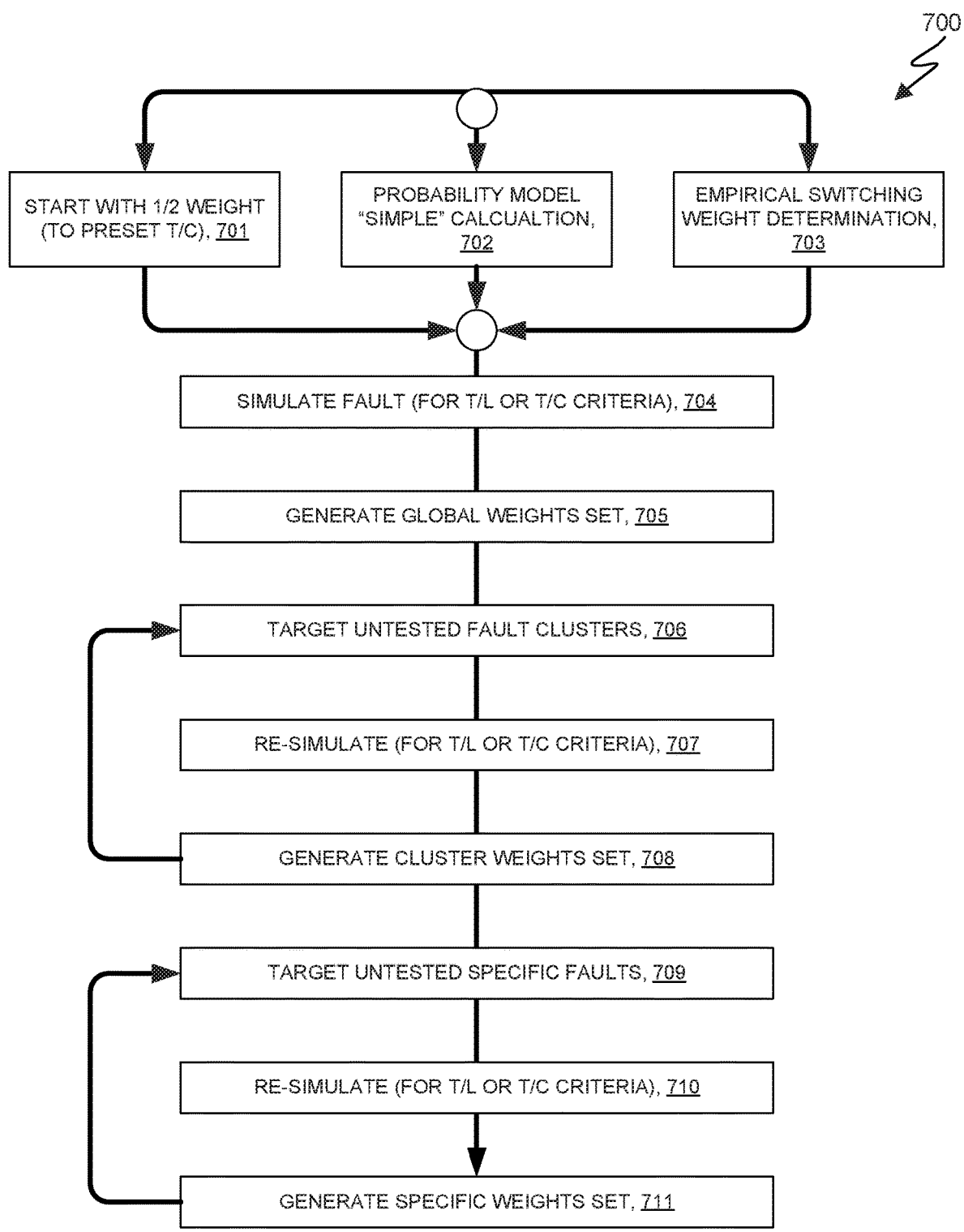
FIG. 7 shows a process flow shows of an approach for initial weight selection in accordance with at least one embodiment of the present invention.

Flowchart 700, of FIG. 7 shows an approach for initial weight selection in accordance with some embodiments of the present invention. Flowchart 700 includes the following operations (with process flow among and between the operations as shown by arrows in FIG. 7): 701; 702; 703; 704; 705; 706; 707; 708; 709; 710; and 711.

Processing begins at one of operations 701, 702, and/or 703. At operation 701, weight configuration module 304, of LBIST optimizing program 300 (see FIG. 3), assigns a predetermined default set of weights to the inputs into the logic block under study. In some embodiments, weight configuration module 304 sets the weights at ½ (0.5) for all inputs. In some embodiments, weight configuration module 304 sets the weights based on outputs from an upstream logic block, outputs of which comprise inputs into the logic block under study. In some embodiments, weight configuration module 304 sets the weights based on a predetermined default weighting configuration At operation 702, weight configuration module 304, of LBIST optimizing program 300 (see FIG. 3), calculates a set of weights, to be applied to the input nets of the logic block, based on a probability model corresponding to the logic block. In some embodiments, probability module 306 generates the probability model (a set of polynomials that describe the respective probability of each net of the logic block). The polynomials which comprise the probability model are based at least in part on the probabilities associated with input nets, logic elements receiving the inputs, and outputs from the logic elements which feed forward as inputs to downstream logic elements and/or as outputs from the logic block. Each polynomial describes the probability associated with the output of each logic element (AND gate, OR gate, inverse gate, etc.), based on a combination of: (i) the probabilities of the inputs to the logic element; and (ii) the logical operation performed by the logic element.

At operation 703, an empirical weight determining module (not shown in the figures), determines a set of weights based on results from a series of tests on the logic block under study, and observing the resulting states of the logic signals, to empirically determine the probabilities respectively corresponding to each logic signal. In some embodiments, the series of tests involves applying of a large number of random (or pseudo-random) inputs to the logic block under study, and observing the respective outputs to estimate the probabilities associated with certain (or all) nets of the logic block.

Processing proceeds at operation 704, where a fault simulation module (not shown in the figures), simulates faults of the logic block under study for any number of tester loops (T/L) simulated, and/or test coverage (T/C) criteria.

Processing proceeds at operation 705, where weight configuration module 304 (see FIG. 3), of LBIST optimizing program 300 (see FIG. 3), generates a set of global weights.

Processing proceeds at operation 706, where the fault simulation module (not shown in the figures) targets untested fault clusters.

Processing proceeds at operation 707, where the fault simulation module (not shown in the figures) re-simulates operation of the logic block under study, with an emphasis on detecting untested fault clusters targeted in operation 706 above, for tester loops and/or test coverage criteria.

Processing proceeds at operation 708, where weight configuration module 304 (see FIG. 3) generates a set of weights aimed at detecting untested fault clusters targeted in operation 706 above. Processing repeats operations 706, 707, and 708 any number of times, where in each iteration, the set of weights is modified to attempt to detect the untested fault clusters targeted in operation 706. The iterations of operations 706, 707, and 708 continues until a stopping criteria is met. Examples of stopping criteria include, without limitation: (i) the number of remaining untested fault clusters declines below a predefined threshold value; (ii) the rate of reduction of remaining untested fault clusters declines below a predefined threshold value (diminishing returns); and/or (iii) expenditure of test time, simulation time, or other testing and/or simulation resources exceeds a predefined threshold value. The set of weights in effect when a stopping criteria is met, are considered to be a target set of weights with respect to detecting untested fault clusters targeted in operation 706 above.

Processing proceeds at operation 709, where the fault simulation module (not shown in the figures) targets specific untested faults.

Processing proceeds at operation 710, where the fault simulation module (not shown in the figures) re-simulates operation of the logic block under study, with an emphasis on detecting specific untested faults targeted in operation 709 above.

Processing proceeds at operation 711, where weight configuration module 304 (see FIG. 3) generates a set of weights aimed at detecting untested specific faults targeted in operation 709 above. Processing repeats operations 709, 710, and 711 any number of times, where in each iteration, the set of weights is modified to attempt to detect the untested specific faults targeted in operation 709. The iterations of operations 709, 710, and 711 continues until a stopping criteria is met. Examples of stopping criteria include, without limitation: (i) the number of remaining untested specific faults declines below a predefined threshold value; (ii) the rate of reduction of remaining untested specific faults declines below a predefined threshold value (diminishing returns); and/or (iii) expenditure of test time, simulation time, or other testing and/or simulation resources exceeds a predefined threshold value. The set of weights in effect when a stopping criteria is met, are considered to be a target set of weights with respect to detecting untested specific faults targeted in operation 711 above.

Processing proceeds at operation 711, where weight configuration module 304 (see FIG. 3) generates a set of weights aimed at detecting specific untested faults targeted in operation 709 above. Processing repeats operations 709, 710, and 711 any number of times, where in each iteration, the set of weights are modified to attempt to detect the specific untested faults targeted in operation 709. The iterations of operations 709, 710, and 711 continues until a stopping criteria is met. Examples of stopping criteria include, without limitation: (i) the number of remaining specific untested faults declines below a predefined threshold value; (ii) the rate of reduction of remaining specific untested faults declines below a predefined threshold value (diminishing returns); and/or (iii) expenditure of test time, simulation time, or other testing and/or simulation resources exceeds a predefined threshold value.

Figures 8A, 8B:
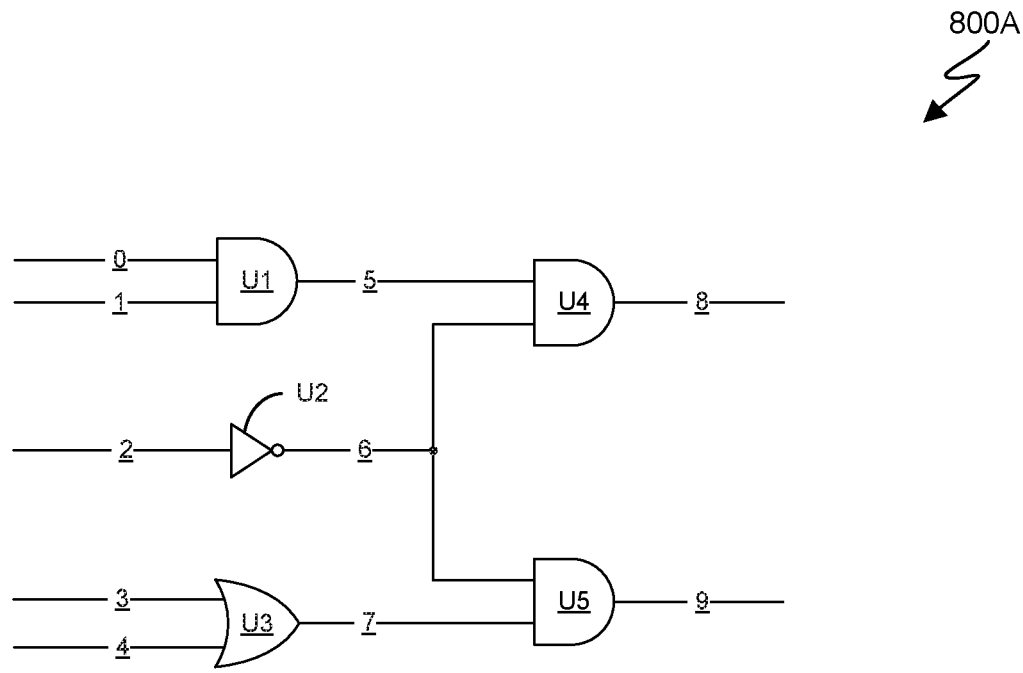
FIG. 8A shows an example logic diagram in accordance with at least one embodiment of the present invention.
FIG. 8B shows a table of probabilities for the example logic diagram in accordance with at least one embodiment of the present invention.

Logic block 800A of FIG. 8A is an example logic block, the basis of an example weight selection process and associated results, in accordance with embodiments of the present invention. The example weight selection process will be illustrated with respect to FIGS. 8A, 8B, 8C, and 8D.

The following logic elements comprise logic block 800A: AND gates U1, U4, and U5; INV gate U2; and OR gate U3.

Logic block 800A has nine nets and is a simplified example logic block for illustration purposes. In some embodiments, there may be thousands or millions of nets, involving a corresponding number of probability calculations. In some embodiments, scan based test and LBIST (which is based on scan based test), applies rules concerning the 'depth' of logical networks. Depth is limited by design rules which prevent nodes from having zero probability of having their states changed and zero probability of propagation of the changed state to an observation latch. While a logic design, in some embodiments, may have millions or billions of logic circuits, if scan based test is employed, the amount of logic in a "logic cone" is constrained to, for example, hundreds of gates with dozens of stim (input nodes) and observation (output nodes) latches.

Nets of logic block 800A are labeled with the numerals 0 through 9, inclusive. Net 0 and net 1 comprise inputs to AND gate U1, and net 5 comprises the output. The probabilities of net 0 and net 1 being logical "1" are, respectively, P{0} and P{1}. Logic analyzer 308 (see FIG. 3) determines that the probability of net 5 being a logical "1" (P{5}) is: P{5}=P{0}×P{1}. Note: the probability notation used hereinafter is as follows: P{net} indicates the probability the "net" will be a logical "1". For instance P{2}=⅞ indicates the probability that net "2" will be a logical "1" is equal to ⅞ (0.875).

Net 2 comprises input to INV gate U2, and net 6 comprises the output. The probability of net 2 being a logical "1" is P{2}. Logic analyzer 308 (see FIG. 3) determines that the probability of net 6 being a logical "1" (P{6}) is the inverse (the complement) of P{2}. That is, P{6}=1−P{2}. For example, if P{2}=⅞, then P{6}=1−⅞=⅛.

Net 3 and net 4 comprise inputs to OR gate U3, and net 7 comprises the output. The probabilities of net 3 and net 4 being a logical "1" are, respectively, P{3} and P{4}. Logic analyzer 308 (see FIG. 3) determines that the probability of net 7 being a logical "1" (P{7}) is: P{7}=((P{3}+P{4})−(P{3}×P{4})).

Nets 0, 1, 2, 3, and 4 are inputs to logic block 800A (the logic circuit under study). In some embodiments, the input nets are outputs from an upstream logic circuit. Nets 5, 6, and 7 are intermediate nets, neither inputs nor outputs of logic block 800A as a whole. Nets 8 and 9 are output nets of logic block 800A. U1, U2, U3, U4, and U5 are logic elements of logic block 800A.

Net 5 and net 6 (respectively, the outputs of AND gate U1 and INV gate U2) comprise inputs to AND gate U4, and net 8 comprises the output. Logic analyzer 308 (see FIG. 3) determines that the probability of net 8 being a logical "1" is: P{8}=P{5}×P{6}=P{0}×P{1}×(1−P{2}).

Net 6 and net 7 (respectively, the outputs of INV gate U2 and OR gate U3) comprise inputs to AND gate U5 and net 9 is the output. Logic analyzer 308 (see FIG. 3) determines that the probability of net 9 being a logical "1" (P{9}) is: P{9}=P{6}×P{7}=(1−P{2})×((P{3}+P{4})−(P{3}×P{4})).

Table 800B, of FIG. 8B, tabulates signal probabilities associated with logic block 800A and the present example weight selection process. A signal probability means that for a given LBIST cycle, a given bit will have a pre-determined probability of being a logical "1". For example, if the probability for net 0 is ½ and the probability for net 1 is ⅞, then over the course of 1,000 LBIST cycles, net 0 will have been a logical "1" approximately 500 times and logical "0" approximately 500 times (in apparently random order), while net 1 will have been logical "1" approximately 875 times, and logical "0" approximately 125 times (also in apparently random order).

Net column 801 corresponds to nets (sometimes referred to as "signal lines" or simply "lines") 0 through 9 of logic block 800A, of FIG. 8A.

Logic gate ID column 802 corresponds to logic gates U1, U2, U3, U4, and U5 of logic block 800A. Logic gate function column 803 denotes logical operations performed by the respectively corresponding logic gates. Nets 5, 6, 7, 8, and 9, are outputs produced by the respective logic gates.

Fan-in column 804 indicates the upstream signals (inputs) applied to the logic gates. For instance, nets 0 and 1 (see fan-in column 804) are inputs to AND gate U1, and net 5 (see net column 801) is the resultant output.

EXH column 805 represents exhaustively determined probability for each net. For example, by default, nets 0, 1, 2, 3, and 4 have 50% probability (of being a logical "1") and 50% probability for the inverse. Net 5, for instance, has a 25% probability (0.25) due to the AND operation performed by U1.

EQU column 806 shows probabilities of the nets as determined by analysis of polynomials, which mathematically model the respectively corresponding functions of the logic gates.

MOC column 807 shows probabilities of the nets as determined by Monte Carlo simulations of logic block 800A operation based on random inputs (nets 0-4). MOC % column 808 shows a difference (expressed as a percentage) between EXH column 805 and MOC column 807. For example, net 0 has a 50% (0.500) probability, while in one embodiment, a Monte Carlo simulation has determined that net 0 has a 50.3% (0.503) probability. Column 808 lists the differences between the analytic polynomial values in column 806, and the respectively corresponding Monte Carlo values in column 807. For net 0, for example, the difference is 0.3% ((0.503−0.500)×100%=0.003×100%=0.3%).

Table 800C of FIG. 8C tabulates probabilities calculated by probability module 306 (see FIG. 3) for intermediate and output nets 5, 6, 7, 8, and 9, given various probabilities applied to an initial grouping of probabilities for the input nets 0, 1, 2, 3, and 4, in the present example weight selection process. Nomenclature used herein for probability of a given net is P[net]. For example, probability for net 0 is denoted as P{0}, and probability for net 5 is denoted as P{5}. Probability refers to the probability that the net will be at a logical "1".

In some embodiments of the present invention, probability module 306 (see FIG. 3) calculates a set of probabilities for each net of a logic block under study. As shown in row 810 of table 800C, weight configuration module 304 (see FIG. 3) sets the initial input weights=½ (0.5000) for the input nets (nets 0 through 4, see FIG. 8A). Probability module 306 (see FIG. 3) calculates respective probabilities for the downstream nets (secondary nets 5, 6, and 7, and output nets 8 and 9), and identifies those nets, based on the initial input weights, where the respective corresponding calculated probabilities meet a set of cutoff criteria. In the embodiment of table 800C, the calculated probabilities (for input probabilities=½ for nets 0 through 4; see row 810 of table 800C) for nets 6, 7, and 9 (respectively 0.5000, 0.7500, and 0.3750) fall between the low and high cutoff values (respectively 0.25 and 0.75). The range between the low and high cutoff values (inclusive) is herein referred to as the target range. Calculated probabilities for nets 5 and 8 (respectively 0.2500 and 0.1250) are at or below the low cutoff value (0.25). Stated another way, the low probability cutoff includes nets 5 and 8 as members in it's set of nets.

In some embodiments, weight configuration module 304 (see FIG. 3) selects ½ (0.5) as an initial set of input weights, to reflect an unbiased probability, which generally is a design goal of a pseudo-random pattern generator (PRPG). An initial search begins with input probability weights=½ for convenience, because a typical starting condition of a PRPG is probability=½. However, in some embodiments, weight configuration module 304 (see FIG. 3) conducts an initial search starting with different initial conditions.

In some embodiments, probability module 306 (see FIG. 3) initially sets default values for the high and low cutoff. In some embodiments, probability module 306 sets the high and low cutoff values based on observing the range of calculated probabilities once a configuration of input probabilities has been established. For instance, establishing the cutoff values (in other words, establishing a target range) in some embodiments, is based on the following: (i) calculating the probabilities of the nets, based on any configuration of input probabilities; (ii) specifying a percentage of nets (or specifying a total number of nets); (iii) selecting high and low cutoff values such that the specified percentage of nets (or the specified total number of nets) fall outside the target range (either falling below the low cutoff or falling above the high cutoff).

In some embodiments of the present invention, a logic block design under study may have thousands or millions of nets, and a corresponding number of probabilities to model and calculate.

Weight configuration module 304 may employ various evaluation methods to determine whether a given weight configuration change (the modification) results in better or worse results. Evaluation methods compare quantifiable aspects of a current result with corresponding aspects of one or more previous results, the various aspects including, without limitation: (i) the number of nets for which the respective probabilities fall within the target range; (ii) a root mean square value based on nets having probabilities that fall outside the target range, and the respective distances the probabilities fall from the corresponding cutoff values (or from the mean); (iii) mean and standard deviation of the probabilities of all nets; (iv) a weighted number of nets falling in the target range, where certain "more important" nets are given a higher weight than others; (v) mean (or median) value and dispersion (for example, range or standard deviation) of the probabilities of all nets; and/or (v) any number of other quantifiable aspects of the results, that produce meaningful results.

Some embodiments take the following approach to determine an optimal input weight configuration (sometimes herein referred to as a target input weight configuration): (i) determine an initial input weight configuration; (ii) calculate resultant probabilities for downstream nets; (iii) identify nets for which the computed probabilities fall within and outside the target range; (iv) based on item (iii) above, modify the input weight configuration and re-calculate resultant probabilities; (v) determine which nets improve or worsen their respective probabilities with respect to the target range, compared to a previous iteration; and/or (vi) repeat items (iv), (v), and (vi), until a stopping criteria has been met. Stopping criteria may be based on computation and/or testing resource utilization budget, time budget, calculated results, etc. In some embodiments, weight configuration module 304 (see FIG. 3) further computes a weighted probability average of all nets, at each iteration, then bases the input weight configuration for the next iteration, at least in part, on the weighted probability average.

Further with respect to item (iv) in the paragraph above, in some embodiments, modifying the input weight configuration comprises changing the weight applied to a given input line by a pre-determined interval. In some embodiments, more than one weight, respectively corresponding to an equal number of input lines are changed by a respectively corresponding number of pre-determined intervals. Some intervals may be applied to increase a weight for a corresponding input line, and some may be applied to decrease a weight for a corresponding input line.

With reference now to table 800C of FIG. 8C, in some embodiments, weight configuration module 304 (see FIG. 3) sets a first (initial) weight selection round based on input probabilities P{0}, P{1}, P{2}, P{3}, and P{4} set at ½ (0.5000), as tabulated in row 810. Probabilities for nets P{5}, P{6}, P{7}, P{8}, and P{9} are determined by calculation to be 0.2500, 0.5000, 0.7500, 0.1250 and 0.3750 respectively. These probabilities, except P{8}, fall between the low and high cutoff values of 0.2500 and 0.7500, inclusive, respectively, and therefore fall within the target range.

P{5} and P{8}, respectively 0.2500 and 0.1250, (highlighted in row 810) are equal to or below the low cutoff value (0.2500). Therefore, in some embodiments, it is desired to raise these probabilities, at least for P{8} while not causing P{5}, P{6}, P{7}, and P{9} fall out of the target range. A second round of weight selection, aimed at doing so is presented below with respect to FIG. 8D.

In some embodiments, an automated weight selection system varies the input probabilities, calculates the consequent output probabilities, and determines if the output probabilities fall within the target range. As shown in row 814 of table 800C, input probabilities of $^{11}/_{16}$ (0.6875), applied to all input nets (0, 1, 2, 3, and 4) has the following results: (i) P{5} has increased from 0.2500 to 0.4727, very close to the desired probability of 0.5000; (ii) P{8} has increased from 0.1250 to 0.1477, still below the cutoff, but the highest P{8} value (column 816) for any set of input values and therefore closest to the desired 0.5000; (iii) P{5}, P{6}, and P{9}, respectively 0.4727, 0.3125, and 0.2820 all fall in the target range (between the low and high cutoff values); and (iv) P{7} (0.9023) rises above the high cutoff value (0.75).

Although P{7} (row 814, 0.9023) is above the high cutoff, for all the other input configurations where P{7} falls in the target range (0.3398, 0.4375, 0.5273, 0.6094, and 0.6836, based on respectively corresponding input probabilities $^{3}/_{16}$, ¼, $^{5}/_{16}$, ⅜, and $^{7}/_{16}$), there is at least one other output probability that falls outside the target range. For example, in row 812 (where P{0} through P{4} are set at $^{3}/_{16}$ (0.1875)), P{5} is 0.0352 and P{8} is 0.0286, both below the low cutoff value (0.2500).

Some embodiments refine the initial grouping of input probability configurations in a second round. Table 800D of FIG. 8D shows a secondary grouping of input configurations, and the consequent respectively corresponding output probabilities. Whereas the input probabilities (P{0} through P{4}) for each row of table 800C are equal, the input probabilities of table 800D are mixed. As above with respect to table 800C, calculated output (downstream) probabilities (P{5} through P{9}) of table 800D are shown for each input configuration.

In some embodiments, the automated weight selection system, based on results obtained in the initial weight selection round of table 800C, further refines the input probabilities and determines respective resultant output probabilities, with a goal of optimizing them such that the output probabilities, on the whole, fall within the target range (fall between the low and high cutoff values).

Some embodiments evaluate the results by determining how many nets (secondary and output)

In the next stage of input probability setting, tabulated in table 800D, the automated weight selection system: (i) holds P{0} and P{1} at $^{11}/_{16}$ (0.6875), based on the previous results (table 800C) which produced the most favorable P{5} and P{8} values of 0.4727 and 0.1477 respectively, as discussed above with respect to row 814 of table 8C; and (ii) varies P{2}, P{3}, and P{4} as tabulated, and computes P{5}, P{6}, P{7}, P{8}, and P{9}.

Row 820, corresponds to the following input probabilities: P{0} and P{1} each set at $^{11}/_{16}$ (0.6875) and P{2}, P{3}, and P{4} each set at $^{7}/_{16}$ (0.4375). This input weighting configuration yields the following computed results for P{5}, P{6}, P{7}, P{8}, and P{9} respectively: 0.4727, 0.5625, 0.6836, 0.2659, and 0.3845. These resultant probabilities all fall within the target range. Further, the weighted probability average (column 822) for P{5}, P{6}, P{7}, P{8}, and P{9} is 0.4447.

All nets meet the criteria (fall within the target range). Therefore, the weight set (input weighting configuration) is complete.

Note: weightings applied to the weighted random test pattern generation are closely related to probabilities of the input nets. For example, if the weighting for net 0 is set at 0.6875, then the probability that net 0 will be a logical "1", after a large number of weighted random test patterns have been generated, will approach 0.6875. In other words, the weights applied to the random test patterns generated as input lines to a logic block, determine the respectively corresponding probabilities of the input lines.

To perform a logic build-in self test (LBIST) for the logic block under study, some embodiments provide inputs to the logic block based on generated pseudo-random patterns modified by the weight set. For the example logic block of FIGS. 8A through 8D, the pseudo-random patterns that comprise inputs to the logic block are modified by the weight set as follows: (i) for nets 0 and 1, the probability is set at $^{11}/_{16}$ (0.6875); and (ii) for nets 2, 3, and 4, the probability is set at $^{7}/_{16}$ (0.4375). For example, over the course of 10,000 weighted random test patterns, inputs to nets 0 and 1 will have been logical "1" approximately 6,875 times, and inputs to nets 2, 3, and 4 will have been logical "1" approximately 4,375 times.

A method in accordance with some embodiments of the present invention comprises: (i) determining a plurality of logical chains of the logical circuit; (ii) generating a weighted bit chain for testing a portion of the plurality of logical chains; (iii) determining an alternate weighted bit chain for at least one logical chain of the plurality of chains, wherein the alternate weighted bit chain is based on determining the percentage (proportion) of fault coverage and fault rate of a given latch of the at least one logical chain based on the weighted chain, and selecting the alternate weighted bit chain based on an improvement in the fault rate of the given latch; (iv) operating the semiconductor chip using the weighted bit chain in the portion of the plurality of logical chains and the alternate weighted bit chain for the at least one logical chain of the plurality of chains.

The example given above illustrates a process of applying first a uniform set of weights, and based on the result, subsequently applying a non-uniform set of weights. Such non-uniform weights may be made further non-uniform by further altering one or more sub chains and eventually to applying fixed ATPG precalculated values, as in FIG. 6, in a manner which reduces the number of nets not covered (stimulated and observed) by tests.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

IV. DEFINITIONS

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

Including/include/includes: unless otherwise explicitly noted, means "including but not necessarily limited to."

User/subscriber: includes, but is not necessarily limited to, the following: (i) a single individual human; (ii) an artificial intelligence entity with sufficient intelligence to act as a user or subscriber; and/or (iii) a group of related users or subscribers.

Data communication: any sort of data communication scheme now known or to be developed in the future, including wireless communication, wired communication and communication routes that have wireless and wired portions; data communication is not necessarily limited to: (i) direct data communication; (ii) indirect data communication; and/or (iii) data communication where the format, packetization status, medium, encryption status and/or protocol remains constant over the entire course of the data communication.

Receive/provide/send/input/output/report: unless otherwise explicitly specified, these words should not be taken to imply: (i) any particular degree of directness with respect to the relationship between their objects and subjects; and/or (ii) absence of intermediate components, actions and/or things interposed between their objects and subjects.

Without substantial human intervention: a process that occurs automatically (often by operation of machine logic, such as software) with little or no human input; some examples that involve "no substantial human intervention" include: (i) computer is performing complex processing and a human switches the computer to an alternative power supply due to an outage of grid power so that processing continues uninterrupted; (ii) computer is about to perform resource intensive processing, and human confirms that the resource-intensive processing should indeed be undertaken (in this case, the process of confirmation, considered in isolation, is with substantial human intervention, but the resource intensive processing does not include any substantial human intervention, notwithstanding the simple yes-no style confirmation required to be made by a human); and (iii) using machine logic, a computer has made a weighty decision (for example, a decision to ground all airplanes in anticipation of bad weather), but, before implementing the weighty decision the computer must obtain simple yes-no style confirmation from a human source.

Automatically/automated/automatic: without any human intervention.

Module/Sub-Module: any set of hardware, firmware and/or software that operatively works to do some kind of function, without regard to whether the module is: (i) in a single local proximity; (ii) distributed over a wide area; (iii) in a single proximity within a larger piece of software code; (iv) located within a single piece of software code; (v) located in a single storage device, memory or medium; (vi) mechanically connected; (vii) electrically connected; and/or (viii) connected in data communication.

Computer: any device with significant data processing and/or machine readable instruction reading capabilities including, but not limited to: desktop computers, mainframe computers, laptop computers, field-programmable gate array (FPGA) based devices, smart phones, personal digital assistants (PDAs), body-mounted or inserted computers, embedded device style computers, and/or application-specific integrated circuit (ASIC) based devices.

What is claimed is:

1. A method for testing a logic circuit of a semiconductor chip, the method comprising:
    determining a plurality of logic chains of the logic circuit, wherein the logic chains are scan chains;
    generating one or more weighted bit chains for testing a first subset of the plurality of logic chains, wherein the one or more weighted bit chains are a series of weighted pseudo-random test patterns;
    determining an alternate weighted bit chain for testing a second subset of the plurality of logic chains, and selecting the alternate weighted bit chain wherein the alternate weighted bit chain is a different set/series of the one or more weighted bit chains and wherein the alternate weighted bit chain is selected from a group consisting of: i) determining proportion of fault coverage and ii) fault observation probability;
    executing a logic built-in self test to perform:
        testing the first subset of the plurality of logic chains based on the weighted bit chain;
        testing the second subset of the plurality of logic chains based on the alternate weighted bit chain.

2. The method of claim 1, wherein:
    executing the logic built-in self test comprises causing a multiplexer, located on the semiconductor chip, to push, onto a logic chain of the plurality of logic chains, a bit chain selected from the group consisting of the weighted bit chain, and the alternate weighted bit chain, and wherein to push is to serially shift or load and wherein selecting the selected bit chain controls generating and applying weights by utilizing a dynamic weight selection mode selected from the group consisting of: (i) channel/latch weight selection; (ii) channel/weight setup; (iii) latch position/weight selection; (iv) latch position weight selection; and wherein the dynamic weight selection mode generates a weighted pattern selected from the group consisting of: (i) channel weight set(s), ii) channel range weights and iii) latch range weights.

3. The method of claim 1, further comprising:
    determining a target output probability range associated with the second subset of the plurality of logic chains.

4. The method of claim 3, further comprising:
    determining that an output probability result falls outside the target output probability range;

in response to determining that the output probability result falls outside the target output probability range:
modifying the alternate weighted bit chain to produce a modified alternate weighted bit chain; and
executing the logic built-in self test to perform testing of the second subset of the plurality of logic chains, based on the modified alternate weighted bit chain.

5. The method of claim 1, wherein:
generating the weighted bit chain comprises loading, onto a set of registers located on the semiconductor chip, the weighted bit chain; and
generating the alternate weighted bit chain comprises loading, onto the set of registers, the alternate weighted bit chain.

6. The method of claim 1, wherein:
testing the first subset of the plurality of logic chains, comprises determining a first number of tester loops that achieve a first threshold percentage of fault coverage based on the weighted bit chain;
testing the second subset of the plurality of logic chains, comprises determining a second number of tester loops that achieve a second threshold percentage of fault coverage based on the alternate weighted bit chain;
testing the first subset of the plurality of logic chains, based on the weighted bit chain, by iterating the built-in self test for at least the first number of tester loops; and
testing the second subset of the plurality of logic chains, based on the alternate weighted bit chain, by iterating the built-in self test for at least the second number of tester loops.

7. A computer program product for testing a logic circuit of a semiconductor chip, the computer program product comprising a computer readable storage medium having stored thereon program instructions programmed to perform:
determining a plurality of logic chains of the logic circuit, wherein the logic chains are scan chains;
generating one or more weighted bit chains for testing a first subset of the plurality of logic chains, wherein the one or more weighted bit chains are a series of weighted pseudo-random test patterns;
determining an alternate weighted bit chain for testing a second subset of the plurality of logic chains, and selecting the alternate weighted bit chain wherein the alternate weighted bit chain is a different set/series of the one or more weighted bit chains and wherein the alternate weighted bit chain is selected from a group consisting of: i) determining proportion of fault coverage and ii) fault observation probability;
executing a logic built-in self test to perform:
testing the first subset of the plurality of logic chains based on the weighted bit chain; and
testing the second subset of the plurality of logic chains based on the alternate weighted bit chain.

8. The computer program product of claim 7, wherein the program instructions are further programmed to perform:
executing the logic built-in self test comprising causing a multiplexer, located on the semiconductor chip, to push, onto a logic chain of the plurality of logic chains, a bit chain selected from the group consisting of the weighted bit chain, and the alternate weighted bit chain, wherein to push is to serially shift or load, and wherein selecting the selected bit chain controls generating and applying weights by utilizing a dynamic weight selection mode selected from the group consisting of: (i) channel/latch weight selection; (ii) channel/weight setup; (iii) latch position/weight selection; (iv) latch position weight selection; and wherein the dynamic weight selection mode generates a weighted pattern selected from the group consisting of: (i) channel weight set(s), ii) channel range weights and iii) latch range weights.

9. The computer program product of claim 7, further comprising program instructions programmed to perform:
determining a target output probability range associated with the second subset of the plurality of logic chains.

10. The computer program product of claim 9, further comprising program instructions programmed to perform:
determining that an output probability result falls outside the target output probability range;
in response to determining that the output probability result falls outside the target output probability range:
modifying the alternate weighted bit chain to produce a modified alternate weighted bit chain; and
executing the logic built-in self test to perform testing of the second subset of the plurality of logic chains, based on the modified alternate weighted bit chain.

11. The computer program product of claim 7, wherein:
generating the weighted bit chain comprises loading, onto a set of registers located on the semiconductor chip, the weighted bit chain; and
generating the alternate weighted bit chain comprises loading, onto the set of registers, the alternate weighted bit chain.

12. The computer program product of claim 7, wherein:
testing the first subset of the plurality of logic chains, comprises determining a first number of tester loops that achieve a first threshold percentage of fault coverage based on the weighted bit chain;
testing the second subset of the plurality of logic chains, comprises determining a second number of tester loops that achieve a second threshold percentage of fault coverage based on the alternate weighted bit chain;
testing the first subset of the plurality of logic chains, based on the weighted bit chain, by iterating the built-in self test for at least the first number of tester loops; and
testing the second subset of the plurality of logic chains, based on the alternate weighted bit chain, by iterating the built-in self test for at least the second number of tester loops.

13. A computer system for testing a logic circuit of a semiconductor chip, the computer system comprising:
a processor set; and
a computer readable storage medium;
wherein:
the processor set is structured, located, connected and/or programmed to run program instructions stored on the computer readable storage medium; and
the program instructions include instructions programmed to perform:
determining a plurality of logic chains of the logic circuit, wherein the logic chains are scan chains;
generating one or more weighted bit chains for testing a first subset of the plurality of logic chains, wherein the one or more weighted bit chains are a series of weighted pseudo-random test patterns;
determining an alternate weighted bit chain for testing a second subset of the plurality of logic chains, and selecting the alternate weighted bit chain wherein the alternate weighted bit chain is a different set/series of the one or more weighted bit chains and wherein the alternate weighted bit chain is selected from a group consisting of: i) determining proportion of fault coverage and ii) fault observation probability;

executing a logic built-in self test to perform:
testing the first subset of the plurality of logic chains based on the weighted bit chain; and
testing the second subset of the plurality of logic chains based on the alternate weighted bit chain.

14. The computer system of claim 13, wherein the program instructions are further programmed to perform:
executing the logic built-in self test comprising causing a multiplexer, located on the semiconductor chip, to push, onto a logic chain of the plurality of logic chains, a bit chain selected from the group consisting of the weighted bit chain, and the alternate weighted bit chain, and wherein to push is to serially shift or load and wherein selecting the selected bit chain controls generating and applying weights by utilizing a dynamic weight selection mode selected from the group consisting of: (i) channel/latch weight selection; (ii) channel/weight setup; (iii) latch position/weight selection; (iv) latch position weight selection; and wherein the dynamic weight selection mode generates a weighted pattern selected from the group consisting of: (i) channel weight set(s), ii) channel range weights and iii) latch range weights.

15. The computer system of claim 13, further comprising program instructions programmed to perform:
determining a target output probability range associated with the second subset of the plurality of logic chains.

16. The computer system of claim 15, further comprising program instructions programmed to perform:
determining that an output probability result falls outside the target output probability range;
in response to determining that the output probability result falls outside the target output probability range:
modifying the alternate weighted bit chain to produce a modified alternate weighted bit chain; and
executing the logic built-in self test to perform testing of the second subset of the plurality of logic chains, based on the modified alternate weighted bit chain.

17. The computer system of claim 13, wherein:
generating the weighted bit chain comprises loading, onto a set of registers located on the semiconductor chip, the weighted bit chain; and
generating the alternate weighted bit chain comprises loading, onto the set of registers, the alternate weighted bit chain.

18. The computer system of claim 13, wherein:
testing the first subset of the plurality of logic chains, comprises determining a first number of tester loops that achieve a first threshold percentage of fault coverage based on the weighted bit chain;
testing the second subset of the plurality of logic chains, comprises determining a second number of tester loops that achieve a second threshold percentage of fault coverage based on the alternate weighted bit chain;
testing the first subset of the plurality of logic chains, based on the weighted bit chain, by iterating the built-in self test for at least the first number of tester loops; and
testing the second subset of the plurality of logic chains, based on the alternate weighted bit chain, by iterating the built-in self test for at least the second number of tester loops.

* * * * *